US009350358B2

(12) United States Patent
Okamoto et al.

(10) Patent No.: US 9,350,358 B2
(45) Date of Patent: May 24, 2016

(54) SEMICONDUCTOR DEVICE

(71) Applicant: Semiconductor Energy Laboratory Co., Ltd., Atsugi-shi, Kanagawa-ken (JP)

(72) Inventors: Yuki Okamoto, Kanagawa (JP); Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/635,257

(22) Filed: Mar. 2, 2015

(65) Prior Publication Data
US 2015/0256182 A1  Sep. 10, 2015

(30) Foreign Application Priority Data

Mar. 6, 2014  (JP) ................................. 2014-043550
Mar. 13, 2014  (JP) ................................. 2014-049713

(51) Int. Cl.
*H03K 19/173*  (2006.01)
*H03K 19/177*  (2006.01)

(52) U.S. Cl.
CPC .................................. *H03K 19/1776* (2013.01)

(58) Field of Classification Search
CPC ................. H03K 19/17728; H03K 19/17736; H03K 19/017581
USPC .......................................... 326/38, 40, 41, 47
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Daniel D Chang
(74) *Attorney, Agent, or Firm* — Fish & Richardson P.C.

(57) ABSTRACT

Provided is a semiconductor device where a signal-transmission speed. The semiconductor device comprises a first logic element, a first switch electrically connected to the first logic element, and a second logic element electrically connected to the first switch. The first logic element includes at least a second switch, and the second switch has a function of setting an output potential from the first logic element to a L level. The first logic element may include a memory electrically connected to a register. The memory has a function of holding data of the register, and the register has a function of setting an output potential to a L level after holding the data in the memory.

24 Claims, 18 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,779,799 B2 | 7/2014 | Takewaki |
| 8,947,121 B2 | 2/2015 | Kurokawa |
| 8,952,722 B2 | 2/2015 | Ikeda et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0293202 A1 | 11/2012 | Nishijima et al. |
| 2013/0207170 A1 | 8/2013 | Kurokawa |
| 2013/0300456 A1 | 11/2013 | Lennon |
| 2013/0314124 A1 | 11/2013 | Ikeda et al. |
| 2014/0103960 A1* | 4/2014 | Yamazaki .......... H03K 19/0013 326/41 |
| 2014/0159771 A1 | 6/2014 | Ikeda et al. |
| 2014/0253174 A1 | 9/2014 | Takewaki |
| 2014/0312932 A1 | 10/2014 | Ikeda |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

(56) References Cited

OTHER PUBLICATIONS

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, andYb2Fe3O7 Types of Structures for Compounds in the In2O3 and Sc2O3-A2O3-BO Systems [A; Fe; Ga; or Al: B; Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 ; SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID

(56) References Cited

OTHER PUBLICATIONS

Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Yuki Okamoto et al.; "Novel Application of Crystalline Indium—Gallium—Zinc—Oxide Technology to LSI:Dynamically Reconfigurable Programmable Logic Device Based on Multi-Context Architecture"; ECS Transactions, vol. 54, No. 1; pp. 141-149; The Electrochemical Society; Jul. 7, 2013.

\* cited by examiner

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to, for example, a semiconductor device, a display device, a light-emitting device, a storage device, a driving method thereof, or a manufacturing method thereof. One embodiment of the present invention particularly relates to a semiconductor device. One embodiment of the present invention particularly relates to, for example, a programmable logic device in which configuration of hardware can be changed and a semiconductor device including the programmable logic device, and a driving method thereof.

2. Description of the Related Art

A programmable logic device (PLD) is an integrated circuit that can function with a circuit structure set by a user after manufacturing. Compared to an integrated circuit in which all circuits are fixed at the time of manufacturing, PLDs have advantages in reduction in development period and flexibility in design specification. PLDs are widely used in semiconductor devices.

Examples of the PLDs are a programmable array logic (PAL) and a generic array logic (GAL) that are small-scale circuits, and a complex programmable logic device (CPLD) and a field programmable gate array (FPGA) that are large-scale circuits. In this specification, a circuit such as a PAL, a GAL, a CPLD, an FPGA, or the like is called a programmable logic device (hereinafter referred to as a PLD).

A PLD includes at least a logic element (hereinafter referred to as an LE). A plurality of LEs are electrically connected to each other with wirings. A function of the PLD can be changed by changing a function of the LE. Moreover, a function of the PLD can be changed by changing a conduction state of wirings between the LEs.

The PLD can include a configuration memory. When the PLD includes a plurality of groups of the configuration memories, different configuration data can be stored. A method where switching of selected configuration data among the groups is performed during operation of the PLD is called a multi-context method. In the PLD having a multi-context function, a circuit structure can be changed at high speed just by selecting a group of configuration data. In addition, while the PLD having the multi-context function performs circuit operation in accordance with the selected configuration data, it can rewrite non-selected configuration data, i.e., can perform dynamic reconfiguration.

The below Non-patent Document 1 describes a PLD with a multi-context method. It describes that a potential of a node SN can increase with a boosting function of a path transistor in the PLD, so that a switching speed can be improved, compared to a case using a conventional SRAM.

REFERENCE

Non-Patent Document

[Non-Patent Document 1]

Y. Okamoto et al., "Novel Application of Crystalline Indium-Gallium-Zinc-Oxide Technology to LSI: Dynamically Reconfigurable Programmable Logic Device Based on Multi-Context Architecture," ECS Trans., Vol. 54, No. 1, pp. 141-149, June 2013.

SUMMARY OF THE INVENTION

If switching speed is improved, a signal-transmission speed between the LEs is improved. Improvement of the signal-transmission speed is an important factor for evaluating performance of a semiconductor device such as a PLD. However, even if the boosting function of a path transistor described in the above non-patent document is used, switching speed might not be improved. This will be described below.

FIG. 10 shows a circuit structure in which a first switch SW11 and a second switch SW12 are disposed between an LE11 and an LE12. The first switch SW11 and the second switch SW12 are collectively referred to as a switch group SW1.

The first switch SW11 has a function of controlling conduction and non-conduction between the LE11 and the LE12. The second switch SW12 can have a structure and a function similar to those of the first switch SW11. Those switches are described below.

The first switch SW11 includes a first transistor M11, a second transistor M12, a third transistor M13, and a first capacitor C11. One of a source and a drain of the first transistor M11 is electrically connected to a gate of the second transistor M12. The one of the source and drain of the first transistor M11 is electrically connected to one of electrodes of the first capacitor C11. One of a source and a drain of the second transistor M12 is electrically connected to one of a source and a drain of the third transistor M13. A gate of the first transistor M11 is electrically connected to a first signal line 101. A signal supplied from the first signal line 101 is expressed as WL[0]. Depending on WL[0], the first transistor M11 is selected. A gate of the third transistor M13 is electrically connected to a second signal line 102. A signal supplied from the second signal line 102 is expressed as CONTEXT[0]. Depending on CONTEXT[0], the third transistor M13 is selected. The signal lines are wirings that can supply the desired signals.

The second switch SW12 includes a fourth transistor M14, a fifth transistor M15, a sixth transistor M16, and a second capacitor C12. One of a source and a drain of the fourth transistor M14 is electrically connected to a gate of the fifth transistor M15. The one of the source and drain of the fourth transistor M14 is electrically connected to one of electrodes of the second capacitor C12. One of a source and a drain of the fifth transistor M15 is electrically connected to one of a source and a drain of the sixth transistor M16. A gate of the fourth transistor M14 is electrically connected to a third signal line 103. A signal supplied from the third signal line 103 is expressed as WL[1]. Depending on WL[1], the fourth transistor M14 is selected. A gate of the sixth transistor M16 is electrically connected to a fourth signal line 104. A signal supplied from the fourth signal line 104 is expressed as CONTEXT[1]. Depending on CONTEXT[1], the sixth transistor M16 is selected. The signal lines are wirings that can supply the desired signals.

The other of the source and drain of the first transistor M11 is electrically connected to the other of the source and drain of the fourth transistor M14. The other of the source and drain of the first transistor M11 and the other of the source and drain of the fourth transistor M14 are electrically connected to a fifth signal line 105. A signal supplied from the fifth signal line 105 is expressed as BL. When the first transistor M11 is selected, the potential of a node SN11 beyond the first transistor M11 can be determined based on BL. The potential can be held by the first capacitor C11. When the fourth transistor M14 is selected, a potential of a node SN12 beyond the fourth transistor M14 can be determined based on BL. The potential can be held by the second capacitor C12. The signal line is a wiring that can supply the desired signals.

The other of the source and drain of the second transistor M12 is electrically connected to the other of the source and drain of the fifth transistor M15. The other of the source and drain of the second transistor M12 and the other of the source and drain of the fifth transistor M15 are electrically connected to an output side of the LE11. A terminal at the output side of the LE11 is expressed as a node ND11. The other of the source and drain of the third transistor M13 is electrically connected to the other of the source and drain of the sixth transistor M16. The other of the source and drain of the third transistor M13 and the other of the source and drain of the sixth transistor M16 are electrically connected to an input side of the LE12. A terminal at the input side of the LE12 is expressed as a node ND12.

With this circuit structure, at least the following operation can be performed. The on/off state of the first transistor M11 is controlled by WL[0]. The on/off state of the fourth transistor M14 is controlled by WL[1]. Configuration data corresponding to BL is written to the first capacitor C11 through the first transistor M11. After that, the first transistor M11 is turned off, and the configuration data is stored in the node SN11.

Configuration data corresponding to BL is written to the second capacitor C12 through the fourth transistor M14. After that, the fourth transistor M14 is turned off, and the configuration data is stored in the node SN12. The on/off state of the second transistor M12 is controlled depending on the configuration data stored in the node SN11. The on/off state of the fifth transistor M15 is controlled depending on the configuration data stored in the node SN12.

A desired circuit structure can be selected by controlling the on/off states of the third transistor M13 and the sixth transistor M16 with CONTEXT[0] and CONTEXT[1], respectively.

FIG. 11 shows a timing chart of the circuit of FIG. 10. FIG. 11 is a timing chart of BL supplied from the fifth signal line 105; WL[0] and WL[1] supplied from the first signal line 101 and the third signal line 103, respectively; CONTEXT[0] supplied from the second signal line 102; and CONTEXT[1] supplied from the fourth signal line 104.

A condition where CONTEXT[0] is at a "H" level and CONTEXT[1] is at a "L" level is described as selection of a first configuration data, while a condition where CONTEXT [0] is at a "L" level and CONTEXT[1] is at a "H" level is described as selection of a second configuration data. Either the first configuration data or the second configuration data can be selected at a time. For example, when the first configuration data is selected, the second configuration data is not selected. Conversely, when the second configuration data is selected, the first configuration data is not selected.

In FIG. 11, a potential that is applied to gates of the transistors M11, M12, M13, M14, M15, and M16 to make these transistors on-state is expressed as a "H" level, and a potential that makes these transistors off-state is expressed as a "L" level. VDD is used as the "H" level potential and GND is used as the "L" level potential. However, such potentials are not limited to VDD or GND as long as there is a relative difference between the potentials. Therefore, the potentials can be expressed as a first potential and a second potential lower than the first potential, or a first potential and a second potential higher than the first potential.

In FIG. 11, the potential of the node ND11 is at the "L" level during from time T0 to T1. Here, BL is set to the "H" level and then WL[0] is set to the "H" level, so that configuration data corresponding to the "H" level can be written using the node SN11 and the first capacitor C11. After that, WL[0] is set to the "L" level to turn off the first transistor M11, so that the configuration data can be stored using the node SN11 and the first capacitor C11. After WL[0] is set to the "L" level, the first transistor M11 is off regardless of whether BL is at the "H" level or at the "L" level. Here, BL is set to the "L" level.

At the time T1, the first configuration data is selected. Specifically, CONTEXT[0] is set to the "H" level to turn on the third transistor M13.

In addition, the potential of the node ND11 on the LE11 side is changed from the "L" level to the "H" level, whereby the potential of the node SN11 is stepped up, for example, to about 2VDD, due to capacitive coupling via gate capacitance of the second transistor M12. Since a voltage between the source and gate of the second transistor M12 is about 2VDD and the third transistor M13 is on, the potential of the node ND12 on the LE12 side is promptly set to the "H" level. As a result, compared to the case where the above step-up action is not performed, the signal-transmission speed between the node ND11 and the node ND12 is improved.

At the time T2, the potential of the node ND11 at the LE11 side is changed from the "H" level to the "L" level, whereby the potential of the node SN11 is stepped down to VDD due to capacitive coupling via the gate capacitance of the second transistor M12. Since a voltage between the source and gate of the second transistor M12 is VDD and the third transistor M13 is on, the potential of the node ND12 is promptly set to the "L" level, compared to the case where the node SN11 is at the GND level.

As shown in FIG. 11, the signal-transmission speed between the node ND11 and the node ND12 is kept high while the first configuration data is selected. That is, once the potential of the node SN11 is stepped up or down due to the capacitive coupling via the gate capacitance of the second transistor M12, the signal-transmission speed between the LE11 and the LE12 is kept high.

Next, during the time from T3 to T4, the potential of the node ND11 is at the "L" level. In the time from T3 to T4, BL is set to the "H" level and WL[1] is set to the "H" level, so that configuration data corresponding to the "H" level can be written using the node SN12 and the second capacitor C12. After that, WL[1] is set to the "L" level to turn off the fourth transistor M14, so that the configuration data can be stored using the node SN12 and the second capacitor C12. After WL[1] is set to the "L" level, the fourth transistor M14 is off regardless of whether BL is at the "H" level or at the "L" level. Here, BL is set to the "L" level.

In and after the time T4, the first configuration data is deselected and the second configuration data is selected. Specifically, CONTEXT[0] is set to the "L" level to turn off the third transistor M13, and CONTEXT[1] is set to the "H" level to turn on the sixth transistor M16.

In addition, the potential of the node ND11 on the LE11 side is changed from the "L" level to the "H" level, whereby the potential of the node SN12 is stepped up, for example, to about 2VDD, due to capacitive coupling via the gate capacitance of the fifth transistor M15. Since a voltage between the source and gate of the fifth transistor M15 is about 2VDD and the sixth transistor M16 is on, the node ND12 on the LE12 side is promptly set to the "H" level. As a result, compared to the case where the above step-up action is not performed, the signal-transmission speed between the node ND11 and the node ND12 is improved.

At the time T5, the potential of the node ND11 at the LE11 side is changed from the "H" level to the "L" level, whereby the potential of the node SN12 is stepped down to VDD due to the capacitive coupling via the gate capacitance of the fifth transistor M15. Since a voltage between the source and gate of the fifth transistor M15 is VDD and the sixth transistor M16 is on, the potential of the node ND12 is promptly set to the "L" level.

As shown in FIG. 11, the signal-transmission speed between the node ND11 and the node ND12 is kept high while the second configuration data is selected. That is, once the potential of the node SN12 is stepped up or down due to the capacitive coupling via the gate capacitance of the fifth transistor M15, the signal-transmission speed between the LE11 and the LE12 is kept high.

Another condition different from that of FIG. 11 is described with reference to FIG. 12.

In FIG. 12, the potential of the node ND11 is at the "L" level during the time from T0' to T1'. In a manner similar to that of FIG. 11, while the potential of the node ND11 is at the "L" level in the time from T0' to T1', BL and WL[0] are sequentially set to the "H" level, so that configuration data corresponding to the "H" level can be written to the first capacitor C11. After that, WL[0] and BL are set to the "L" level to turn off the first transistor M11, so that the configuration data in the node SN11 is stored.

At the time T1', the first configuration data is selected. Specifically, CONTEXT[0] is set to the "H" level to turn on the third transistor M13.

In addition, the potential of the node ND11 on the LE11 side is changed from the "L" level to the "H" level, whereby the potential of the node SN11 is stepped up, for example, to about 2VDD, due to capacitive coupling via the gate capacitance of the second transistor M12. As a result, similar to the case in FIG. 11, compared to the case where the above step-up action is not performed, the signal-transmission speed between the node ND11 and the node ND12 is improved.

At the time T2', the potential of the node ND11 at the LE11 side is changed from the "H" level to the "L" level, whereby the potential of the node SN11 is stepped down to VDD due to the capacitive coupling via the gate capacitance of the second transistor M12. Since a voltage between the source and gate of the second transistor M12 is VDD, the node ND12 is promptly set to the "L" level.

Next, in the time from T3' to T4', the potential of the node ND11 is at the "H" level. In the time from T3' to T4', when the potential of the node ND11 is at the "H" level, BL and WL[1] are sequentially set to the "H" level, so that configuration data corresponding to the "H" level can be written using the node SN12 and the second capacitor C12. After that, WL[1] is set to the "L" level to turn off the fourth transistor M14, so that the configuration data can be stored using the node SN12 and the second capacitor C12.

In and after the time T4', the first configuration data is deselected and the second configuration data is selected. Specifically, CONTEXT[0] is set to the "L" level to turn off the third transistor M13, and CONTEXT[1] is set to the "H" level to turn on the sixth transistor M16.

Here, if operations in the time T4' starts while the node ND11 at the LE11 side is at the "H" level, the potential of the node ND11 on the LE11 side is changed from the "H" level to the "L" level later. In this case, the potential of the node SN12 is not stepped up, but rather stepped down to a potential smaller than VDD and close to GND due to the capacitive coupling via the gate capacitance of the fifth transistor M15.

At the time T5', the potential of the node ND11 on the LE11 side is changed from the "L" level to the "H" level. The potential of the node SN12 is stepped down in the time T4' and kept smaller than VDD, and thus a drive capability of the fifth transistor M15 is low. In this way, the signal-transmission speed between the node ND11 and the node ND12 is low in some cases.

Furthermore, if the potential of the node SN12 is largely stepped down, the potential of the node SN12 might be changed from the "H" level to the "L" level. In this case, it is even possible that correct logic signals are not transmitted between the node ND11 and the node ND12.

As described above, in a case of the multi-context method where the non-selected configuration data is rewritten during operation corresponding to the selected configuration data, the signal-transmission speed between the nodes ND11 and ND12 may decrease depending on the potential of the node ND11.

One embodiment of the present invention provides a circuit structure in which an output potential of an LE can be set to a "L" level, and a driving method thereof, in order to solve at least one of the above-mentioned problems. Another embodiment of the present invention provides a novel circuit. Another embodiment of the present invention provides a novel driving method of a novel circuit. Another embodiment of the present invention provides a novel semiconductor device. Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first logic element; a first switch electrically connected to the first logic element; and a second logic element electrically connected to the first switch. The first logic element includes at least a second switch, and the second switch has a function of setting an output potential from the first logic element to a L level.

One embodiment of the present invention is a semiconductor device including a first logic element; a first switch electrically connected to the first logic element; and a second logic element electrically connected to the first switch. The first logic element includes at least a logical conjunction circuit, and the logical conjunction circuit has a function of setting an output potential from the first logic element to a L level.

One embodiment of the present invention is a semiconductor device including a first logic element; a first switch electrically connected to the first logic element; and a second logic element electrically connected to the first switch. The first logic element includes at least an AND circuit, and the AND circuit has a function of setting an output potential from the first logic element to a L level.

In one embodiment of the present invention, the first switch includes a first transistor, a second transistor, a third transistor, and a capacitor. A gate of the second transistor is electrically connected to one of a source and a drain of the first transistor and to a first electrode of the capacitor. A gate of the first transistor is electrically connected to a first signal line. A gate of the third transistor is electrically connected to a second signal line, and has a function of selecting one of a plurality of contexts based on a signal from the second signal line.

In one embodiment of the present invention, the first transistor may include an oxide semiconductor layer, and the second transistor may include an oxide semiconductor layer.

One embodiment of the present invention is a semiconductor device including a first logic element; a switch electrically connected to the first logic element; and a second logic element electrically connected to the switch. The first logic element includes at least a memory electrically connected to a register. The memory has a function of holding data of the register, and the register has a function of setting an output potential to a L level after the memory holds the data.

In one embodiment of the present invention, the memory may include a transistor having an oxide semiconductor layer.

With one embodiment of the present invention, a semiconductor device where a signal-transmission speed is improved using a step-up effect of a charge retention node due to capacitive coupling during configuration, and a driving method thereof, are provided.

According to one embodiment of the present invention, the semiconductor device in which signal-transmission speed is not decreased and a driving method thereof are provided. Another embodiment of the present invention provides a novel semiconductor device. Another embodiment of the present invention provides a driving method of a novel semiconductor device. Note that the description of these effects does not disturb the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1:
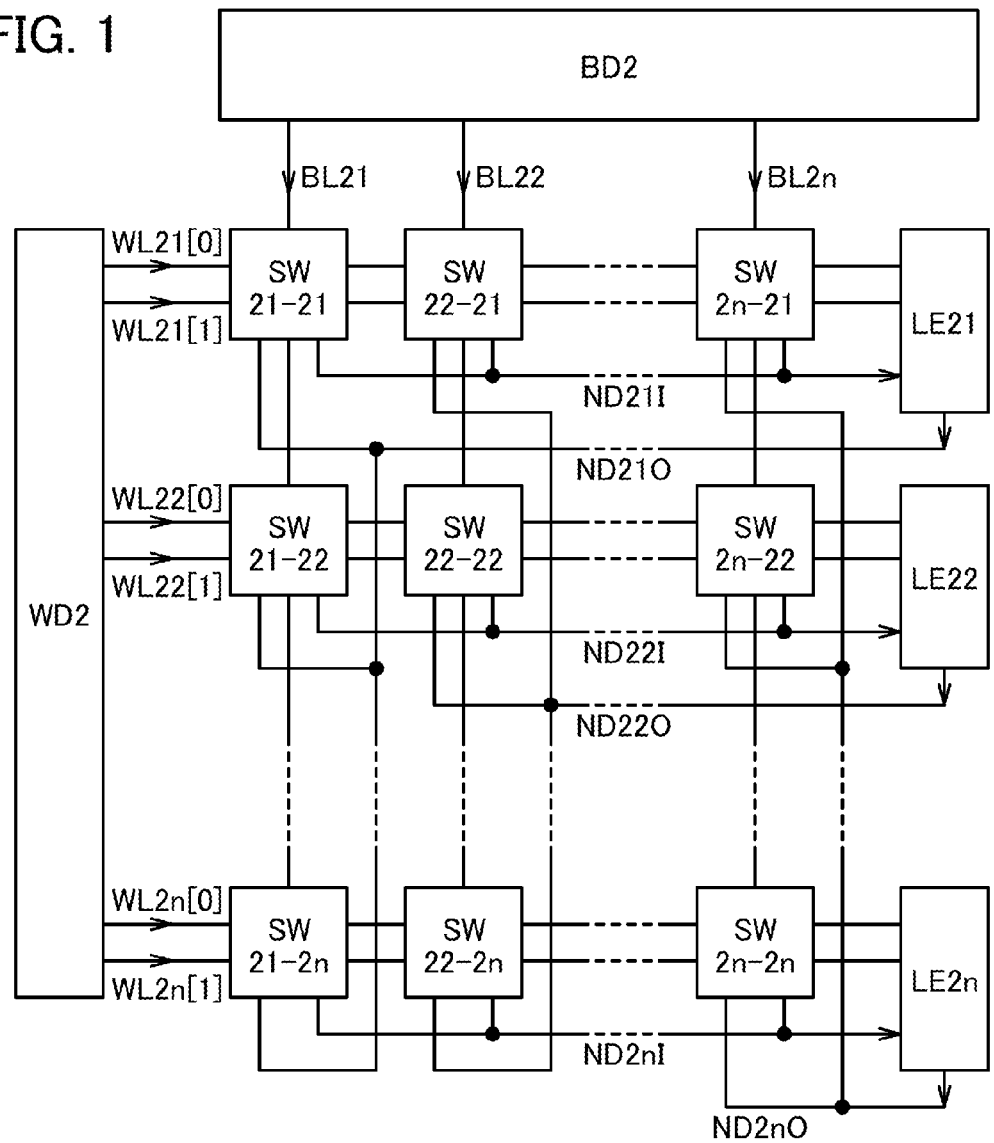
FIG. 1 illustrates a structure of a semiconductor device of one embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

Figure 11:
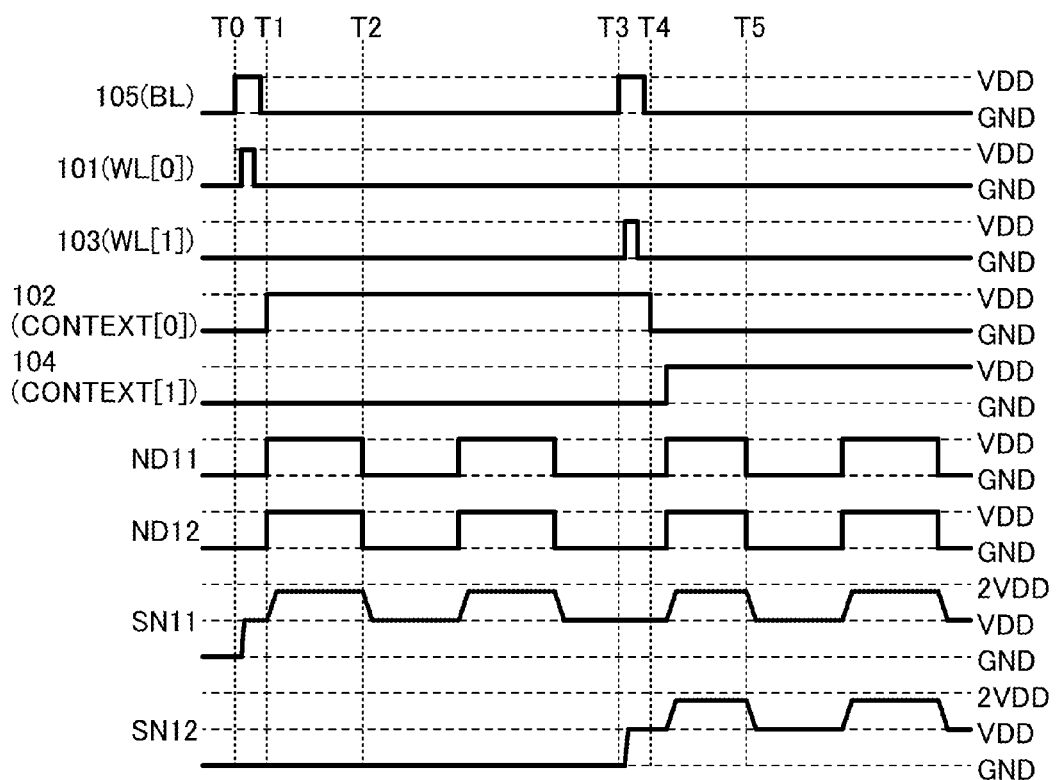
FIG. 11 illustrates a timing chart.
Figure 12:
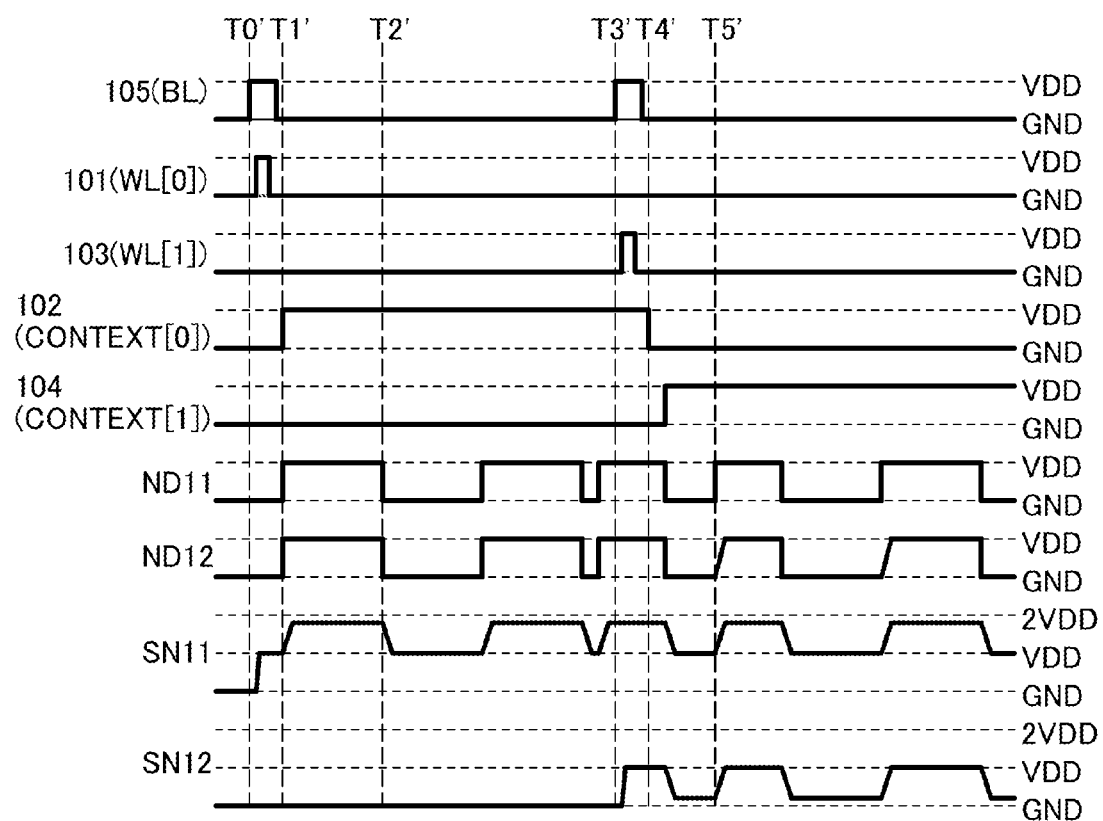
FIG. 12 illustrates a timing chart.

Here, in terms of the difference between the above described timing chart of FIG. 11 and that of FIG. 12, it is clear that the potential of the node ND11 that is an output potential of the LE11 is preferably at the "L" level at least during writing of configuration data (that is, the time T4 in FIG. 11 and the time T4' in FIG. 12) for improving the signal-transmission speed between the nodes ND11 and ND12.

Embodiment 1

In this embodiment, a structure of a semiconductor device where an output potential of an LE is at the "L" level during writing of configuration data is described.

FIG. 1 shows a circuit structure of a PLD according to one embodiment of the present invention. As shown in FIG. 1, the PLD includes a plurality of LEs (LE21, LE22, . . . , LE2$n$), a plurality of switches (SW21-21, 21-22, . . . , SW21-2$n$, SW22-21, SW22-22, . . . , SW22-2$n$, . . . , SW2$n$-21, SW2$n$-22, . . . , SW2$n$-2$n$), a first driver, and a second driver. The first driver functions as a bit driver (BD2), and the second driver functions as a word driver (WD2). The plurality of switches (SW) electrically connects the plurality of LEs with each other.

A configuration memory is included in the LEs. The LEs each have a function of outputting a certain output signal in accordance with an input signal based on configuration data stored in the configuration memory.

The plurality of switches have a function of controlling conduction states (on/off) between the plurality of LEs. In FIG. 1, at least the switches SW21-21, SW22-21, . . . , SW2$n$-21, SW21-22, . . . , SW21-2$n$ are electrically connected to the LE21. The switches SW21-21, SW22-21, . . . , SW2$n$-21 are electrically connected to at least an input side of the LE21. The switches SW21-21, 21-22 . . . , SW21-2$n$ are electrically connected to at least the input side and an output side of the LE21. Since a structure like FIG. 1 is employed in the circuit, the number of switches is larger than that of LEs.

Although the LE21 has one input terminal in FIG. 1, the LE21 may have a plurality of input terminals, and for example, it can include four input terminals. In this case, the number of switches electrically connected to the LE21 will be larger than that in the circuit structure in FIG. 1.

The bit driver (BD2) and the word driver (WD2) have a function of controlling configuration of the LEs and the switches. The word driver (WD2) has a function of outputting a signal WL, and a function of selecting a signal line to which WL is output. Other than the bit driver (BD2) and the word driver (WD2), a controller and the like are also included.

A plurality of switches on which configuration is performed are selected by WL. In the circuit structure in FIG. 1, the switches on which the configuration is performed are selected by two kinds of signals (WL[0], WL[1]). The selected switches are configured by configuration data that depends on the potential of BL. Specifically, when the switch SW21-22 is selected based on two kinds of signals (WL22[0], WL22[1]), for example, the switch SW21-22 is configured by configuration data that depends on the potential of BL21.

Figure 2:
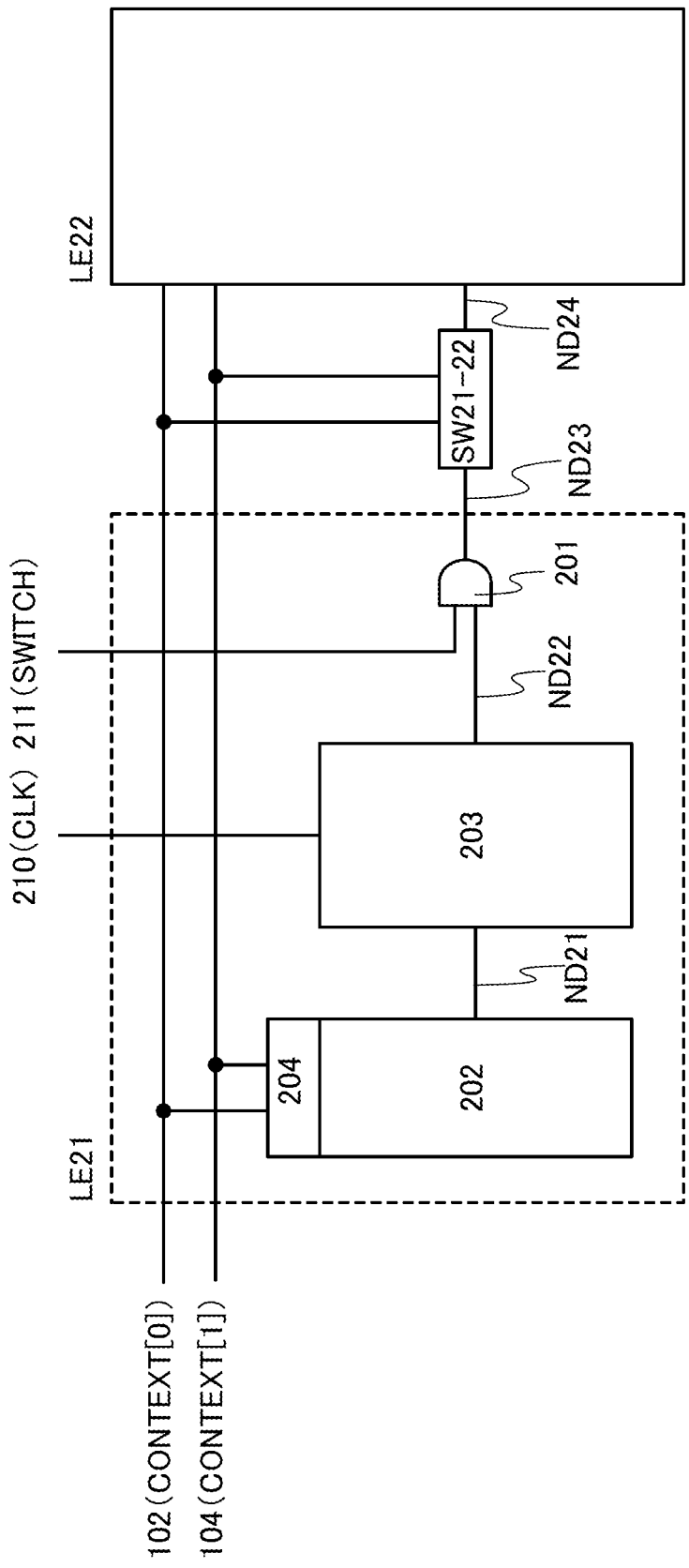
FIG. 2 illustrates a structure of a semiconductor device of one embodiment.

With FIG. 2, two LEs and a switch between them in FIG. 1 are more specifically described. The two LEs are LE21 and LE22. A switch between the LE21 and the LE22 is expressed as SW21-22.

The LE of one embodiment of the present invention is characterized by including a switch. FIG. 2 is a case where the LE21 is provided with a switch 201. The LE22 may include a similar switch. The LEs in FIG. 1 may also include similar switches.

The switch 201 has a logical conjunction circuit. The logical conjunction circuit has two or more input terminals and one output terminal. The logical conjunction circuit is a circuit that outputs "1" from the output terminal only when "1" is input to all the input terminals, and outputs "0" in the other cases. For the logical conjunction circuit, an AND circuit can be used, for example.

The switch 201 is controlled by a signal (SWITCH) output from the controller. SWITCH is input from the eleventh signal line 211 to the switch 201. Even when an output signal from a register 203 is at a "H" level, a "L" level signal is output from the switch 201 by setting the SWITCH to a "L" level.

As described above, by having at least the switch 201, the LE21 can output a "L" level signal.

The register 203 has a function of holding an output signal from a lookup table (hereinafter referred to as LUT) 202, and outputting a corresponding output value in synchronization with a signal from a tenth signal line 210 (a clock signal, hereinafter referred to as CLK).

A node ND21 is between the LUT 202 and the register 203. A node ND22 is between the register 203 and the switch 201.

In addition, the LE21 includes a memory 204. Based on configuration data that the memory 204 has, the LUT 202 defines logical operation to be performed. The LUT 202 outputs one defined output signal in response to a plurality of input signals.

The memory 204 is electrically connected to a second signal line 102 and a fourth signal line 104. A signal CONTEXT[0] for selecting a first configuration data is supplied to the second signal line 102. A signal CONTEXT[1] for selecting a second configuration data is supplied to the fourth signal line 104. CONTEXT[0] and CONTEXT[1] are output from the controller.

A condition where CONTEXT[0] is at a "H" level and CONTEXT[1] is at a "L" level is described as selection of a first configuration data, while a condition where CONTEXT[0] is at a "L" level and CONTEXT[1] is at a "H" level is described as selection of a second configuration data. Either the first configuration data or the second configuration data can be selected at a time. For example, when the first configuration data is selected, the second configuration data is not selected. Conversely, when the second configuration data is selected, the first configuration data is not selected.

A desired circuit structure can be obtained by selection of either the first configuration data or the second configuration data. In addition, during circuit operation corresponding to the selected configuration data, the non-selected configuration data can be changed. That is, the semiconductor device has a multi-context function.

In this embodiment, a potential to select a configuration data is expressed as a potential at a "H" level, and a potential for deselection is expressed as a potential at a "L" level. VDD is used as the "H" level potential and GND is used as the "L" level potential. However, such potentials are not limited to VDD or GND as long as there is a relative difference between the potentials.

The LE22 may have the same structure as the above described structure of the LE21, and may include a switch 201.

The switch SW21-22 provided between the LE21 and the LE22 is electrically connected to the second signal line 102 and the fourth signal line 104.

A node ND23 is between the LE21 and the switch SW21-22. A node ND24 is between the switch SW21-22 and the LE22.

Figure 3:
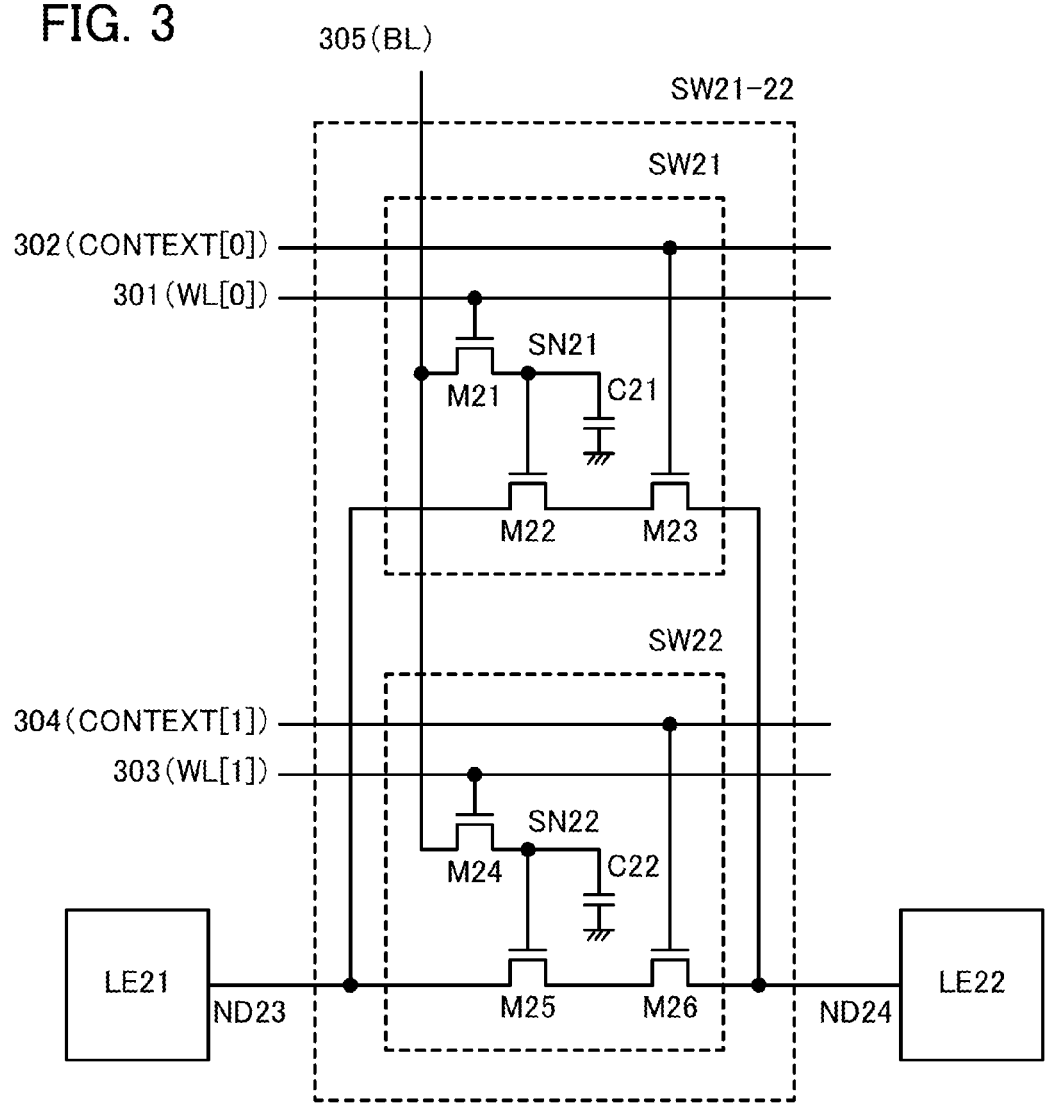
FIG. 3 illustrates a structure of a semiconductor device of one embodiment.

FIG. 3 illustrates a circuit structure of the switch SW21-22. The switch SW21-22 includes a first switch SW21 and a second switch SW22. The switch SW21-22 can include a plurality of switches, which are collectively referred to as a switch group. The first switch SW21 has a function of controlling conduction and non-conduction between the LE21 and the LE22. The second switch SW22 can have a structure and a function similar to those of the first switch SW21. Those switches are described below.

The first switch SW21 includes a first transistor M21, a second transistor M22, a third transistor M23, and a first capacitor C21. One of a source and a drain of the first transistor M21 is electrically connected to a gate of the second transistor M22. The one of the source and drain of the first transistor M21 is electrically connected to one of electrodes of the first capacitor C21. One of a source and a drain of the second transistor M22 is electrically connected to one of a source and a drain of the third transistor M23. A gate of the first transistor M21 is electrically connected to a first signal line 301. A signal supplied from the first signal line 301 is expressed as WL[0]. Depending on WL[0], the first transistor M21 is selected. A gate of the third transistor M23 is electrically connected to a second signal line 302. A signal supplied from the second signal line 302 is expressed as CONTEXT[0]. Depending on CONTEXT[0], the third transistor M23 is selected. The signal lines are wirings that can supply the desired signals.

The second switch SW22 includes a fourth transistor M24, a fifth transistor M25, a sixth transistor M26, and a second capacitor C22. One of a source and a drain of the fourth transistor M24 is electrically connected to a gate of the fifth transistor M25. The one of the source and drain of the fourth transistor M24 is electrically connected to one of electrodes of the second capacitor C22. One of a source and a drain of the fifth transistor M25 is electrically connected to one of a source and a drain of the sixth transistor M26. A gate of the fourth transistor M24 is electrically connected to a third signal line 303. A signal supplied from the third signal line 303 is expressed as WL[1]. A gate of the sixth transistor M26 is electrically connected to a fourth signal line 304. A signal supplied from the fourth signal line 304 is expressed as CONTEXT[1]. The signal lines are wirings that can supply the desired signals.

The other of the source and drain of the first transistor M21 is electrically connected to the other of the source and drain of the fourth transistor M24. The other of the source and drain of the first transistor M21 and the other of the source and drain of the fourth transistor M24 are electrically connected to a fifth signal line 305. A signal supplied from the fifth signal line 305 is expressed as BL. When the first transistor M21 is selected, the potential of a node SN21 beyond the first transistor M21 can be determined based on BL. The potential can be held by the first capacitor C21. When the fourth transistor M24 is selected, a potential of a node SN22 beyond the fourth transistor M24 can be determined based on BL. The potential can be held by the second capacitor C22. The signal line is a wiring that can supply the desired signals.

The other of the source and drain of the second transistor M22 is electrically connected to the other of the source and drain of the fifth transistor M25. The other of the source and drain of the second transistor M22 and the other of the source and drain of the fifth transistor M25 are electrically connected to an output side of the LE21. A terminal at the output side of the LE21 is expressed as a node ND23. The other of the source and drain of the third transistor M23 is electrically connected to the other of the source and drain of the sixth transistor M26. The other of the source and drain of the third transistor M23 and the other of the source and drain of the sixth transistor M26 are electrically connected to an input side of the LE22. A terminal at the input side of the LE22 is expressed as a node ND24.

With this circuit structure, at least the following operation can be performed. The on/off state of the first transistor M21 is controlled by WL[0], and configuration data corresponding to a signal supplied from the fifth signal line 305 can be written using the node SN21 and the first capacitor C21. The on/off state of the second transistor M22 is controlled depending on the configuration data stored in the node SN21. A desired circuit structure can be selected by controlling the on/off state of the third transistor M23 using CONTEXT[0].

The on/off state of the fourth transistor M24 is controlled by WL[1], and configuration data corresponding to BL is written using the node SN22 and the second capacitor C22. The on/off state of the fifth transistor M25 is controlled depending on the configuration data stored in the node SN22. A desired circuit structure can be selected by controlling the on/off state of the sixth transistor M26 using CONTEXT [1].

Figure 4:
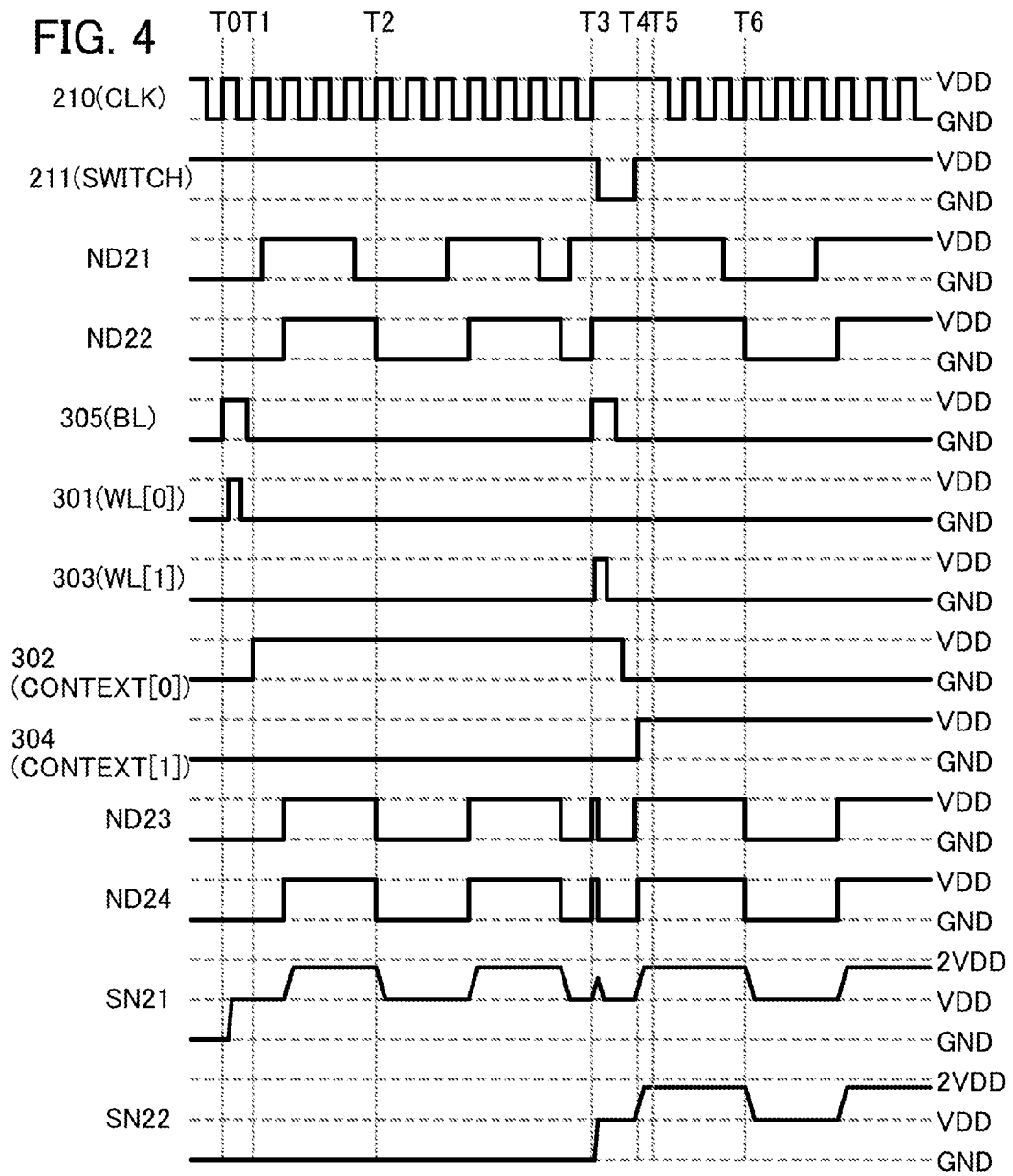
FIG. 4 illustrates a timing chart of one embodiment.

FIG. 4 shows a timing chart of the circuit of FIG. 3. Here, as an output value of the LUT 202, an output waveform of the node ND21 is output. In addition, VDD, GND are used as a potential at the "H" level and a potential at the "L" level, respectively. However, such potentials are not limited to VDD or GND as long as there is a relative difference between the potentials. Therefore, potentials are expressed as a first potential and a second potential lower than the first potential, or a first potential and a second potential higher than the first potential.

During the time from T0 to T1, that is, while the potential of the node ND23 is at the "L" level, BL and WL[0] are sequentially set to the "H" level, so that configuration data corresponding to the "H" level can be written using the node SN21 and the first capacitor C21. After that, WL[0] and BL are sequentially set to the "L" level to turn off the first transistor M21, so that the configuration data can be stored using the node SN21 and the first capacitor C21. Since the configuration data needs to be stored for a certain period, a transistor including an oxide semiconductor is preferably used as the first transistor M21. Because of extremely small off-state current of a transistor including an oxide semiconductor, the first capacitor C21 does not necessarily have to be provided.

Note that after WL[0] is set to the "L" level, the first transistor M21 is off regardless of whether BL is at the "H" level or at the "L" level.

At the time T1, the first configuration data is selected. Specifically, CONTEXT[0] is set to the "H" level to turn on the third transistor M23.

In addition, the potential of the node ND23 on the LE21 side is changed from the "L" level to the "H" level, whereby the potential of the node SN21 is stepped up, for example, to about 2VDD, due to capacitive coupling via gate capacitance of the second transistor M22. Since a voltage between the source and gate of the second transistor M22 is about 2VDD and the third transistor M23 is on, the potential of the node ND24 on the LE22 side is promptly set to the "H" level. As a result, compared to the case where the above step-up action is not performed, a signal-transmission speed between the node ND23 and the node ND24 is improved.

The smaller the capacitance of the first capacitor C21 is, the more largely the potential of the node SN21 is stepped up. As a result, the signal-transmission speed gets even higher. It is preferable to use an oxide semiconductor for the first transistor M21 since the capacitance of the first capacitor C21 will be smaller than that in a case where the first transistor M21 is formed using a silicon semiconductor.

For the second transistor M22, any transistor such as a transistor including an oxide semiconductor or a transistor including silicon may be used. A transistor including an oxide semiconductor, whose on-state current is thought to be smaller than that of a transistor including silicon, can be used since the voltage between the source and gate of the second transistor M22 is stepped up and a signal-transmission speed is improved.

At the time T2, the potential of the node ND23 at the LE21 side is changed from the "H" level to the "L" level, whereby the potential of the node SN21 is stepped down to VDD due to the capacitive coupling via the gate capacitance of the second transistor M22. Since a voltage between the source and gate of the second transistor M22 is VDD and the third transistor M23 is on, the potential of the node ND24 is promptly set to the "L" level, compared to the case where the node SN11 is at the GND level.

As shown in FIG. 4, the signal-transmission speed between the node ND23 and the node ND24 is kept high while the first configuration data is set. That is, once the potential of the node SN21 is stepped up or down due to the capacitive coupling via the gate capacitance of the second transistor M22, the signal-transmission speed between the LE21 and the LE22 is kept high.

Next, configuration of the second configuration data starts during the time from T3 to T4. At this time, although both potentials of the node ND21 and the node ND22 are at the "H" level, an output from the logical conjunction circuit can be set to the "L" level by setting a signal (SWITCH) from the eleventh signal line 211 to the "L" level. As a result, the potential of the node ND23 can be surely set to the "L" level compared to the case without a logical conjunction circuit.

Similarly, the potential of the node ND24 can be surely set to the "L" level.

Therefore, while the potential of the node ND23 is set to the "L" level during from the time T3 to T4, BL and WL[1] are sequentially set to the "H" level, so that configuration data corresponding to the "H" level can be written using the node SN22 and the second capacitor C22. After that, WL[1] and BL are sequentially set to the "L" level to turn off the fourth transistor M24, so that the configuration data can be stored using the node SN22 and the second capacitor C22.

Note that as long as the potential of the node ND23 is at the "L" level during configuration of the second configuration data, the timing of changing the potential of the eleventh signal line 211 (SWITCH) to the "L" level may be immediately before the configuration of the second configuration data.

After completion of the configuration of the second configuration data, CONTEXT[0] is set to the "L" level to turn off the third transistor M23, so that the first configuration data is deselected.

In addition, the potential of the eleventh signal line 211 (SWITCH) is set to the "H" level, whereby a logic signal of the node ND22 in FIG. 2 is transmitted to the node ND23. That is, the potential of the node ND23 is changed from the "L" level to the "H" level. Therefore, the potential of the node SN22 is stepped up, for example, to about 2VDD due to the capacitive coupling via gate capacitance of the fifth transistor M25. The voltage between the source and gate of the fifth transistor M25 is about 2VDD.

At the time T4, the second configuration data is selected. Specifically, CONTEXT[1] is set to the "H" level to turn on the sixth transistor M26, so that the logic signal of the node ND23 is transmitted to the node ND24. At this time, since the potential of the node SN22 is stepped up, the signal-transmission speed between the node ND23 and the node ND24 is improved compared to the case where a step-up action is not performed.

Here, the potential the node ND24 changes in conjunction with the potential of the node ND23. When the potential of the eleventh signal line 211 (SWITCH) is set to the "L" level, the potential of the node ND24 can be set to "L" level.

In FIG. 4, there is a possibility that data of a register 203 included in the LE22 is rewritten to a wrong value since the potential of the node ND24 is set to the "L" level during the time from T3 to T4. However, a signal from the tenth signal line 210 (CLK) is stopped during the time from T3 to T5, whereby the data of the register 203 included in the LE22 is held without change from the data immediately before the time T3. That is, even when the output signal from the LE21 is set to the "L" level by the signal from the eleventh signal line 211 (SWITCH), transmittance of a wrong logic signal to the LE22 can be prevented.

At the time T6, the potential of the node ND23 on the LE21 side is changed from the "H" level to the "L" level, whereby the potential of the node SN22 is stepped down to VDD due to the capacitive coupling via the gate capacitance of the fifth transistor M25. Since the voltage between the source and gate of the fifth transistor M25 is VDD, the potential of the node ND24 is promptly set to the "L" level.

As shown in FIG. 4, the signal-transmission speed between the node ND23 and the node ND24 is kept high while the second configuration data is selected. That is, once the potential of the node SN22 is stepped up or down due to the capacitive coupling via the gate capacitance of the fifth transistor M25, the signal-transmission speed between the LE21 and the LE22 is kept high.

Although the number of contexts is two in this embodiment, the number of contexts may be three or more.

Embodiment 2

In this embodiment, a structure of a semiconductor device where an output potential of an LE is at the "L" level during writing of configuration data is described.

Figure 13:
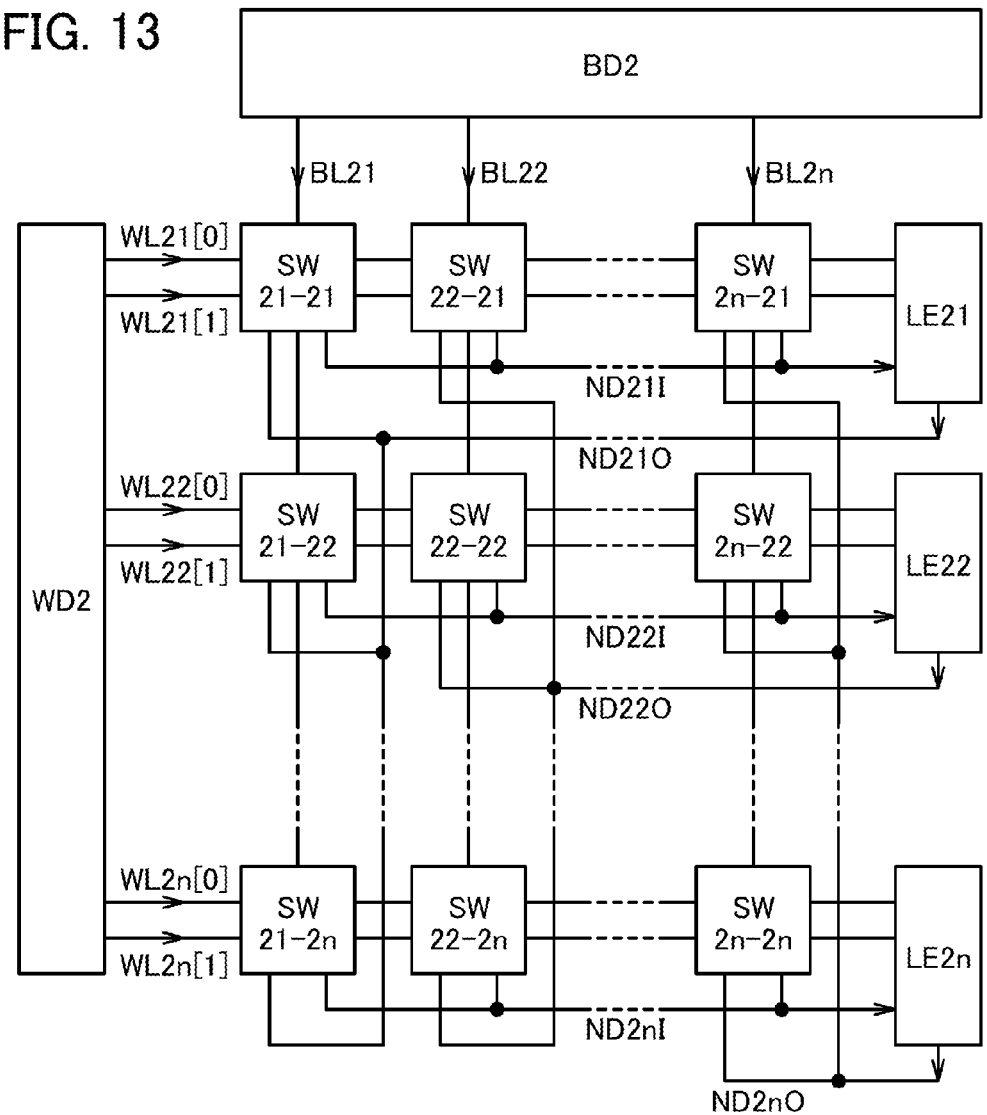
FIG. 13 illustrates a structure of a semiconductor device of one embodiment.

FIG. 13 shows a circuit structure of a PLD according to one embodiment of the present invention. As shown in FIG. 13, the PLD includes a plurality of LEs (LE21, LE22, ..., LE2n), a plurality of switches (SW21-21, 21-22, ..., SW21-2n, SW22-21, SW22-22, ..., SW22-2n, ..., SW2n-21, SW2n-22, ..., SW2n-2n), a first driver, and a second driver. The first driver functions as a bit driver (BD2), and the second driver functions as a word driver (WD2). The plurality of switches (SW) electrically connects the plurality of LEs with each other.

A configuration memory is included in the LEs. The LEs each have a function of outputting a certain output signal in accordance with an input signal based on configuration data stored in the configuration memory.

The plurality of switches have a function of controlling conduction states (on/off) between the plurality of LEs. In FIG. 13, at least the switches SW21-21, SW22-21, ..., SW2n-21, SW21-22, ..., SW21-2n are electrically connected to the LE21. The switches SW21-21, SW22-21, ..., SW2n-21 are electrically connected to at least an input side of the LE21. The switches SW21-21, 21-22 ..., SW21-2n are electrically connected to at least the input side and an output side of the LE21. Since a structure like FIG. 13 is employed in the circuit, the number of switches is larger than that of LEs.

Although the LE21 has one input terminal in FIG. 13, the LE21 may have a plurality of input terminals, and for example, it can include four input terminals. In this case, the number of switches electrically connected to the LE21 will be larger than that in the circuit structure in FIG. 13.

The bit driver (BD2) and the word driver (WD2) have a function of controlling configuration of the LEs and the switches. The word driver (WD2) has a function of outputting WL, and a function of selecting a signal line to which WL is output. Other than the bit driver (BD2) and the word driver (WD2), a controller and the like are also included.

A plurality of switches on which configuration is performed are selected by WL. In the circuit structure in FIG. 13, the switches on which the configuration is performed are selected by two kinds of signals (WL[0], WL[1]). The selected switches are configured by configuration data that depends on the potential of BL. Specifically, when the switch SW21-22 is selected based on two kinds of signals (WL22[0], WL22[1]), for example, the switch SW21-22 is configured by configuration data that depends on the potential of BL21.

Figure 14:
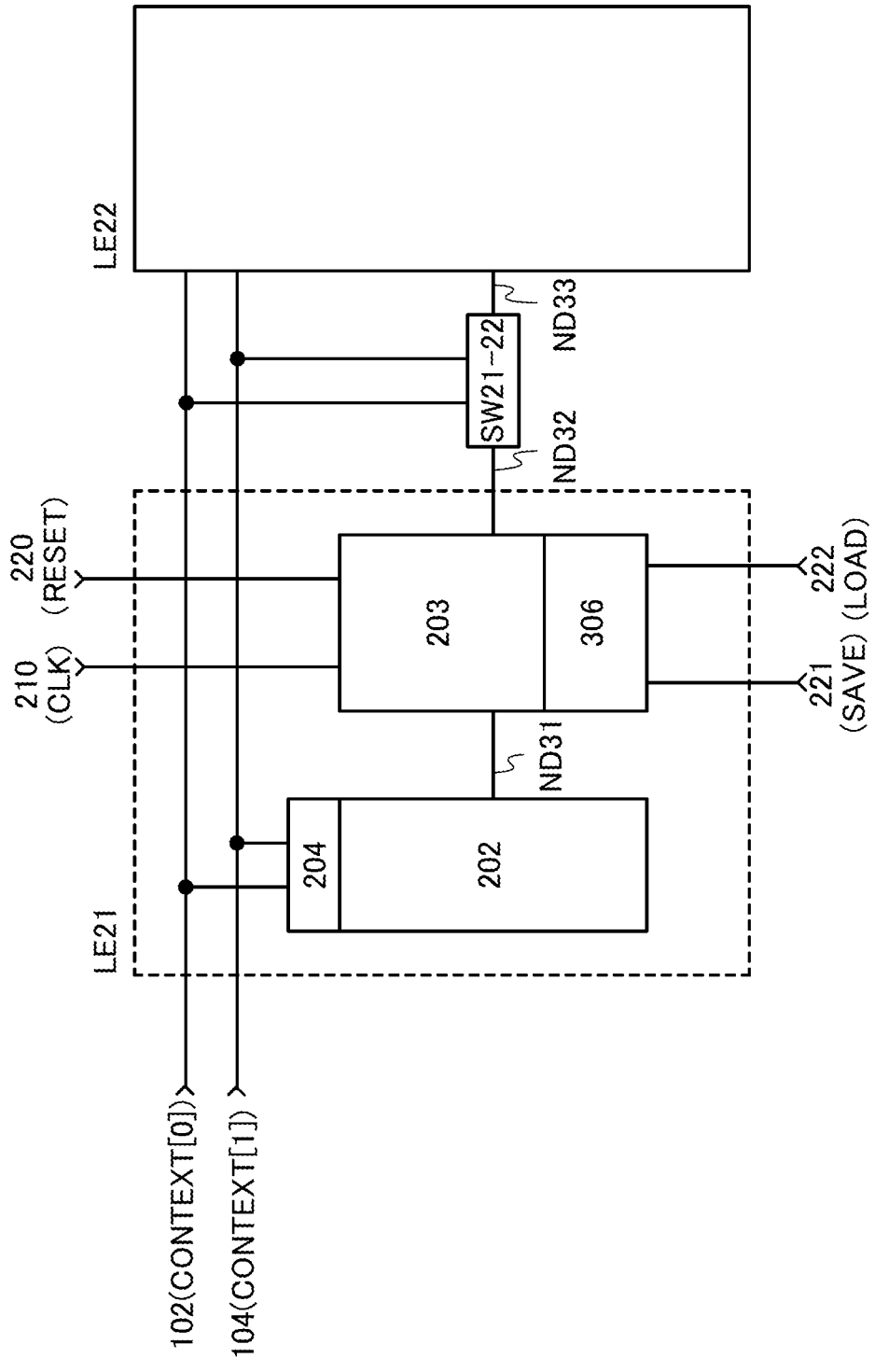
FIG. 14 illustrates a structure of a semiconductor device of one embodiment.

With FIG. 14, two LEs and a switch between them in FIG. 13 are more specifically described. The two LEs are LE21 and LE22. A switch between the LE21 and the LE22 is expressed as SW21-22.

The LE of one embodiment of the present invention includes a second memory. FIG. 14 illustrates a case where the LE21 is provided with a second memory. The LE22 may include a similar second memory. The LEs in FIG. 13 may also include similar memories.

The second memory has at least a function of holding data of the register 203 and resetting the data of the register 203 (setting to a "L" level). Although a non-volatile memory or the like may be used, a memory circuit using an oxide semiconductor is preferred since data save and data load are repeated. A specific example of a memory circuit or the like using an oxide semiconductor is described in <Example of Second Memory 306> below. A "L" level signal is output from the LE21 by setting the data of the register 203 to the "L" level. The register 203 is a sequential circuit, and has a function of holding input data.

As described above, including at least the second memory, the LE21 can output the "L" level signal without losing data of the register 203.

The register 203 has a function of resetting data of the register 203 (setting to a "L" level) according to a signal (RESET) from a 20th signal line 220. Here, the data of the register 203 is reset when the potential of the 20th signal line 220 is at the "H" level. The second memory 306 has a function of holding data of the register 203 in an inner memory of the second memory 306 according to a signal (SAVE) from the 21st signal line 221. The second memory 306 also has a function of reading out the held data of the register 203 when necessary according to a signal (LOAD) from the 22nd signal line 222. Here, the second memory 306 holds data of the register 203 when a signal (SAVE) from the 21st signal line 221 is at the "H" level, and reads out the data of the register 203 when a signal (LOAD) from the 22nd signal line 222 is at the "H" level.

The register 203 has a function of holding an output signal from a lookup table (LUT) 202, and outputting a corresponding output value in synchronization with a signal from a tenth signal line 210 (a clock signal, or CLK).

A node ND31 is between the LUT 202 and the register 203. A node ND32 is between the register 203 and the switch SW21-22.

In addition, the LE21 includes a memory (also referred to as a first memory) 204. Based on configuration data that the memory 204 has, the LUT 202 defines logical operation to be performed. The LUT 202 outputs one defined output signal with respect to a plurality of input signals.

The memory 204 is electrically connected to a second signal line 102 and a fourth signal line 104. A signal CONTEXT[0] for selecting a first configuration data is supplied to the second signal line 102. A signal CONTEXT[1] for selecting a second configuration data is supplied to the fourth signal line 104. CONTEXT[0] and CONTEXT[1] are output from the controller.

A condition where CONTEXT[0] is at a "H" level and CONTEXT[1] is at a "L" level is described as selection of a first configuration data, while a condition where CONTEXT[0] is at a "L" level and CONTEXT[1] is at a "H" level is described as selection of a second configuration data. Either the first configuration data or the second configuration data can be selected at a time. For example, when the first configuration data is selected, the second configuration data is not selected. Conversely, when the second configuration data is selected, the first configuration data is not selected.

A desired circuit structure can be obtained by selection of either the first configuration data or the second configuration data. In addition, during circuit operation corresponding to a selected configuration data, a non-selected configuration data can be changed. That is, the semiconductor device has a multi-context function.

In this embodiment, a potential to select a configuration data is expressed as a potential at a "H" level, and a potential to deselect is expressed as a potential at a "L" level. VDD is used as the "H" level potential and GND is used as the "L" level potential. However, such potentials are not limited to VDD or GND as long as there is a relative difference between the potentials The LE22 may have the same structure as the above described structure of the LE21, that is, the LE22 may also include a second memory.

The switch SW21-22 provided between the LE21 and the LE22 is electrically connected to the second signal line 102 and the fourth signal line 104.

A node ND32 is between the LE21 and the switch SW21-22. A node ND33 is between the switch SW21-22 and the LE22.

Figure 15:
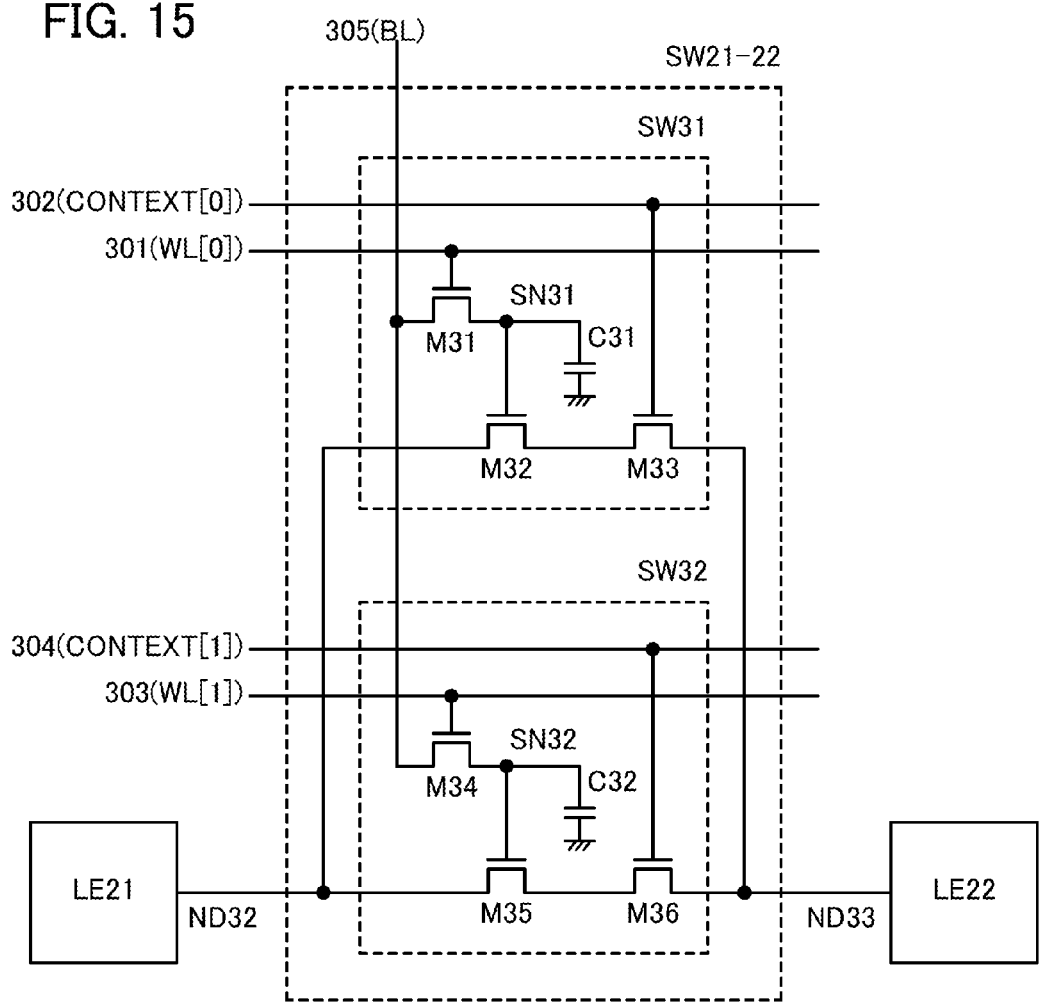
FIG. 15 illustrates a structure of a semiconductor device of one embodiment.

FIG. 15 illustrates a circuit structure of the switch SW21-22. The switch SW21-22 includes a first switch SW31 and a second switch SW32. The switch SW21-22 may include a plurality of switches, which are collectively referred to as a switch group. The first switch SW31 has a function of controlling conduction and non-conduction between the LE21 and the LE22. The second switch SW32 can have a structure and a function similar to those of the first switch SW31. Those switches are described below.

The first switch SW31 includes a first transistor M31, a second transistor M32, a third transistor M33, and a first capacitor C31. One of a source and a drain of the first transistor M31 is electrically connected to a gate of the second transistor M32. The one of the source and drain of the first transistor M31 is electrically connected to one of electrodes of the first capacitor C31. One of a source and a drain of the second transistor M32 is electrically connected to one of a source and a drain of the third transistor M33. A gate of the first transistor M31 is electrically connected to a first signal line 301. A signal supplied from the first signal line 301 is expressed as WL[0]. Depending on WL[0], the first transistor M31 is selected. A gate of the third transistor M33 is electrically connected to a second signal line 302. A signal supplied from the second signal line 302 is expressed as CONTEXT[0]. Depending on CONTEXT[0], the third transistor M33 is selected. The signal lines are wirings that can supply the desired signals.

The second switch SW32 includes a fourth transistor M34, a fifth transistor M35, a sixth transistor M36, and a second capacitor C32. One of a source and a drain of the fourth transistor M34 is electrically connected to a gate of the fifth transistor M35. The one of the source and drain of the fourth transistor M34 is electrically connected to one of electrodes of the second capacitor C32. One of a source and a drain of the fifth transistor M35 is electrically connected to one of a source and a drain of the sixth transistor M36. A gate of the fourth transistor M34 is electrically connected to a third signal line 303. A signal supplied from the third signal line 303 is expressed as WL[1]. A gate of the sixth transistor M36 is electrically connected to a fourth signal line 304. A signal supplied from the fourth signal line 304 is expressed as CONTEXT[1]. The signal lines are wirings that can supply the desired signals.

The other of the source and drain of the first transistor M31 is electrically connected to the other of the source and drain of the fourth transistor M34. The other of the source and drain of the first transistor M31 and the other of the source and drain of the fourth transistor M34 are electrically connected to a fifth signal line 305. A signal supplied from the fifth signal line 305 is expressed as BL. When the first transistor M31 is selected, the potential of a node SN31 beyond the first transistor M31 can be determined based on BL. The potential can be held by the first capacitor C31. When the fourth transistor M34 is selected, a potential of a node SN32 beyond the fourth transistor M34 can be determined based on BL. The potential can be held by the second capacitor C32. The signal line is a wiring that can supply the desired signals.

The other of the source and drain of the second transistor M32 is electrically connected to the other of the source and drain of the fifth transistor M35. The other of the source and drain of the second transistor M32 and the other of the source and drain of the fifth transistor M35 are electrically connected to an output side of the LE21. A terminal at the output side of the LE21 is expressed as a node ND32. The other of the source and drain of the third transistor M33 is electrically connected to the other of the source and drain of the sixth transistor M36. The other of the source and drain of the third transistor M33 and the other of the source and drain of the sixth transistor M36 are electrically connected to an input side of the LE22. A terminal at the input side of the LE22 is expressed as a node ND33.

With this circuit structure, at least the following operation can be performed. The on/off state of the first transistor M31 is controlled by WL[0], and configuration data corresponding to a signal supplied from the fifth signal line 305 can be written using the node SN31 and the first capacitor C31. The on/off state of the second transistor M32 is controlled depending on the configuration data stored in the node SN31. A desired circuit structure can be selected by controlling the on/off state of the third transistor M33 using CONTEXT[0].

The on/off state of the fourth transistor M34 is controlled by WL[1], and configuration data corresponding to BL is written using the node SN32. The on/off state of the fifth transistor M35 is controlled depending on the configuration data stored in the node SN32. A desired circuit structure can be selected by controlling the on/off state of the sixth transistor M36 using CONTEXT[1].

Figure 16:
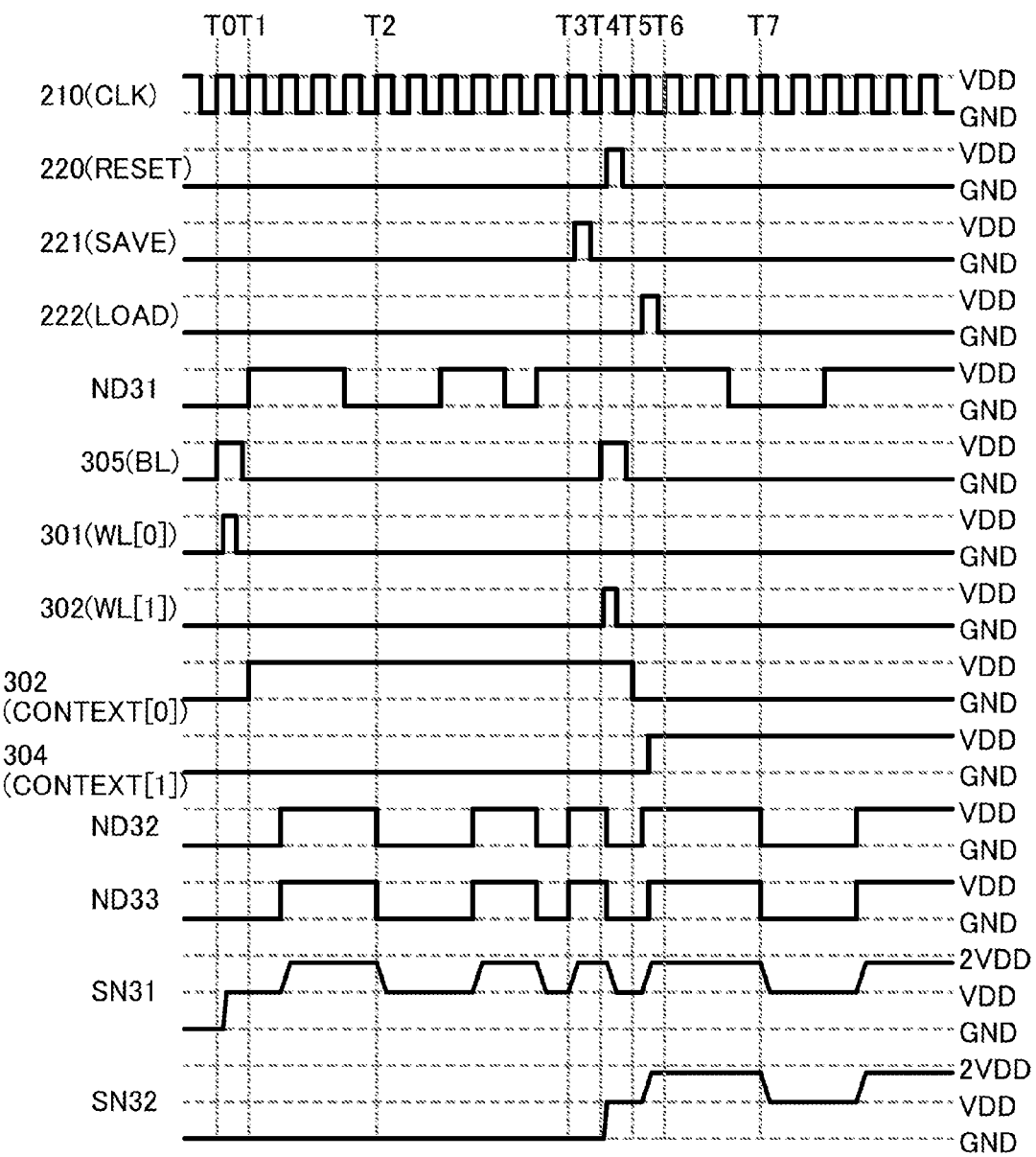
FIG. 16 illustrates a timing chart of an embodiment.

FIG. 16 shows a timing chart of the circuit of FIG. 15. Here, as an output value of the LUT 202, an output waveform of the node ND31 is output. In addition, VDD is used as the "H" level potential and GND is used as the "L" level potential. However, such potentials are not limited to VDD or GND as long as there is a relative difference between the potentials. Therefore, the potentials can be expressed as a first potential and a second potential lower than the first potential, or a first potential and a second potential higher than the first potential.

During the time from T0 to T1, that is, while the potential of the node ND32 is at the "L" level, BL and WL[0] are sequentially set to the "H" level, so that configuration data corresponding to the "H" level can be written using the node SN31 and the first capacitor C31. After that, WL[0] and BL are sequentially set to the "L" level to turn off the first transistor M31, so that the configuration data can be stored using the node SN31 and the first capacitor C31. Since the configuration data needs to be stored for a certain period, a transistor including an oxide semiconductor is preferably used as the first transistor M31. Because of extremely small off-state current of a transistor including an oxide semiconductor, the first capacitor C31 does not necessarily have to be provided.

Note that after WL[0] is set to the "L" level, the first transistor M31 is off regardless of whether BL is at the "H" level or at the "L" level.

At the time T1, the first configuration data is selected. Specifically, CONTEXT[0] is set to the "H" level to turn on the third transistor M33.

In addition, the potential of the node ND32 on the LE21 side is changed from the "L" level to the "H" level, whereby the potential of the node SN31 is stepped up, for example, to about 2VDD, due to capacitive coupling via the gate capacitance of the second transistor M32. Since a voltage between the source and gate of the second transistor M32 is about 2VDD and the third transistor M33 is on, the potential of the node ND33 on the LE22 side is promptly set to the "H" level. As a result, compared to the case where the above step-up action is not performed, a signal-transmission speed between the node ND32 and the node ND33 is improved.

The smaller the capacitance of the first capacitor C31 is, the more largely the potential of the node SN31 is stepped up. As a result, the signal-transmission speed gets even higher. It is preferable to use an oxide semiconductor for the first transistor M31 since the capacitance of the first capacitor C31 will be smaller than that in a case where the first transistor M31 is formed using a silicon semiconductor.

For the second transistor M32, any transistor such as a transistor including an oxide semiconductor or a transistor including silicon may be used. A transistor including an oxide semiconductor, whose on-state current is thought to be smaller than that of a transistor including silicon, can be used since the voltage between the source and gate of the second transistor M32 is stepped up and a signal-transmission speed is improved.

At the time T2, the potential of the node ND32 at the LE21 side is changed from the "H" level to the "L" level, whereby the potential of the node SN31 is stepped down to VDD due to the capacitive coupling via the gate capacitance of the second transistor M32. Since a voltage between the source and gate of the second transistor M32 is VDD and the third transistor M33 is on, the potential of the node ND33 is promptly set to the "L" level, compared to the case where the node SN11 is at the GND level.

As shown in FIG. 16, the signal-transmission speed between the node ND32 and the node ND33 is kept high while the first configuration data is set. That is, once the potential of the node SN31 is stepped up or down due to the capacitive coupling via the gate capacitance of the second transistor M32, the signal-transmission speed between the LE21 and the LE22 is kept high.

During the time from T3 to T4, the data of the register 203 is saved in the second memory 306. That is, by setting the SAVE to the "H" level, the data of the node ND32 (i.e., the potential at the "H" level) is saved in the second memory 306.

Next, configuration of the second configuration data starts during the time from T4 to T5. At this time, although the potential of the node ND31 is at the "H" level, the data and output of the register 203 can be set to the "L" level by changing the potential of the RESET to the "H" level. That is, the potential of the node ND32 can be set to the "L" level forcibly.

Since the transistors M32 and M33 are on, the node ND32 and the node ND33 are in the conduction state. Therefore, the potential of the node ND33 is set to the "L" level.

Therefore, during the time from T4 to T5, that is, while the potential of the node ND32 is at the "L" level, BL and WL[1] are set to the "H" level, so that configuration data corresponding to the "H" level can be written using the node SN32 and the second capacitor C32. After that, WL[1] and BL are set to the "L" level to turn off the fourth transistor M34, so that the configuration data can be stored using the node SN32 and the second capacitor C32.

Note that as long as the potential of the node ND32 is at the "L" level during configuration of the second configuration data, the timing of changing the potential of the RESET to the "H" level may be before the configuration of the second configuration data if the potential of the SAVE is already set to the "H" level to save the data of the register 203.

After completion of configuration of the second configuration data, CONTEXT[0] is set to the "L" level to turn off the third transistor M33, so that the first configuration data is deselected.

During the time from T5 to T6, the data saved in the second memory 306 is loaded into the register 203. The data that is saved in the second memory 306 during the time from T3 to T4 (i.e., the potential at the "H" level) is loaded into the register 203 by setting the potential of the LOAD to the "H" level. That is, the potential of the node ND32 is changed from the "L" level to the "H" level. Therefore, the potential of the node SN32 is stepped up, for example, to about 2VDD due to the capacitive coupling via the gate capacitance of the fifth transistor M35. The voltage between the source and gate of the fifth transistor M35 is about 2VDD.

After that, CONTEXT[1] is set to the "H" level to turn on the sixth transistor M36, so that the logic signal of the node ND32 is transmitted to the node ND33. At this time, since the potential of the node SN32 is stepped up, the signal-transmission speed between the node ND32 and the node ND33 is improved compared to the case where a step-up action is not performed.

Here, the potential the node ND24 changes in conjunction with the potential of the node ND23. From the save of the data in the second memory to the load thereof, the potential of the node ND33 can be set to "L" level.

At the time T7, the potential of the node ND32 is changed from the "H" level to the "L" level, whereby the potential of the node SN32 is stepped down to VDD due to the capacitive coupling via the gate capacitance of the fifth transistor M35. Since the voltage between the source and gate of the fifth transistor M35 is VDD, the potential of the node ND33 is promptly set to the "L" level.

As shown in FIG. 16, the signal-transmission speed between the node ND32 and the node ND33 is kept high while the second configuration data is selected. That is, once the second configuration data is configured while the potential of the node SN32 is at the "L" level, the signal-transmission speed between the LE21 and the LE22 is kept high.

If a circuit illustrated in FIG. 15 or the like is used, data change of the register 203 in synchronization with a signal CLK from the tenth signal line 210 is not problematic since the data of the register 203 during the time from T3 to T4 is saved in the second memory 306. That is, if a circuit illustrated in FIG. 16 or the like is used, a signal CLK from the tenth signal line 210 can be stopped. Alternatively, a clock frequency from the tenth signal line 210 can be slowed.

Although the number of contexts is two in this embodiment, the number of contexts may be three or more.

<Example of Second Memory 306>

Figure 17:
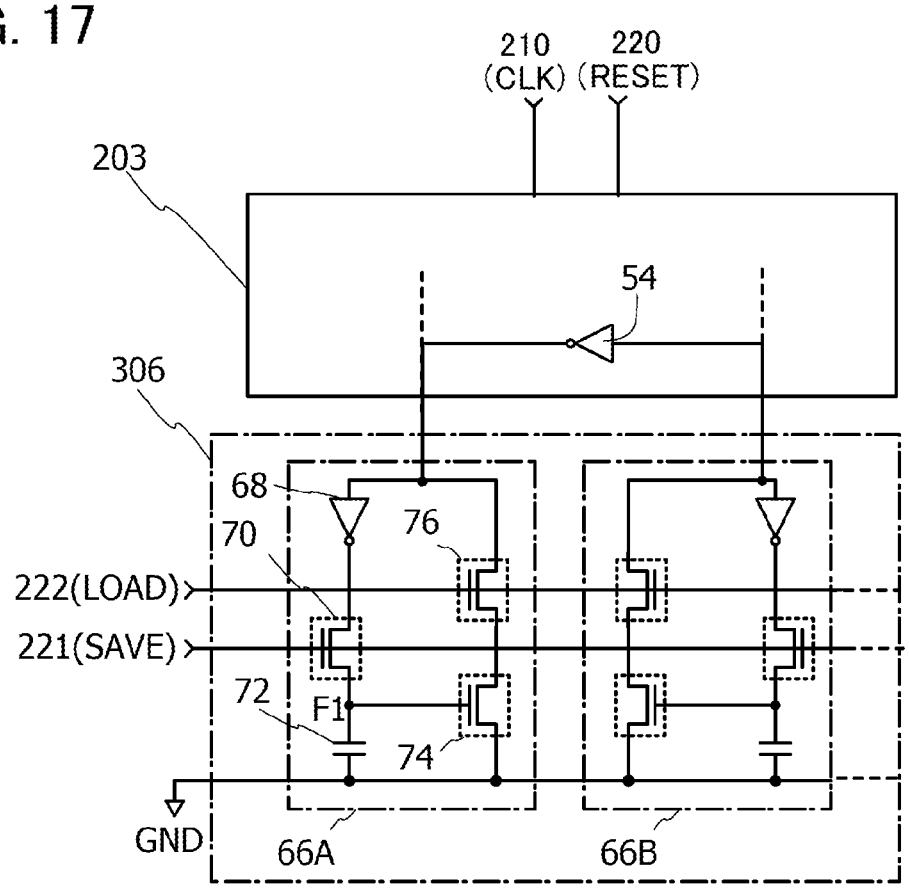
FIG. 17 illustrates a structure of a semiconductor device of one embodiment.

FIG. 17 illustrates an example of the second memory 306. The second memory 306 electrically connected to the register 203 includes a plurality of circuits including at least a first inverter 68, a first transistor 70, a second transistor 74, a third transistor 76, and a capacitor 72. One of the circuits is expressed as a circuit 66A, and another is expressed as 66B. The circuit 66A is electrically connected to the circuit 66B through a second inverter 54. The data at the "H" level or at the "L" level of the register 203 can be held with a group of the circuits 66A and 66B.

An input terminal of the first inverter 68 is electrically connected to the register 203. An output terminal of the first inverter 68 is electrically connected to one of a source and a drain of the first transistor 70. A gate of the first transistor 70 is electrically connected to the 21st signal line 221, and a signal SAVE is input to the gate of the first transistor 70. A gate of the second transistor 74 is electrically connected to the other of the source and drain of the first transistor 70. The other of the source and drain of the first transistor 70 is electrically connected to a first electrode of the capacitor 72. This connection portion is referred to as a node F1. A gate of the third transistor 76 is electrically connected to the 22nd signal line 222, and a signal LOAD is input to the gate of the third transistor 76. One of a source and a drain of the third transistor 76 is electrically connected to one of a source and a drain of the second transistor 74. The other of the source and drain of the third transistor 76 is electrically connected to the input terminal of the first inverter 68.

In the second memory 306, the first transistor 70 preferably includes an oxide semiconductor. Since a transistor including an oxide semiconductor has an extremely low off-state current, data can be surely held with the node F1 and the capacitor 72, compared to a case of using a transistor including silicon, through which an off-state current easily flows.

A transistor including an oxide semiconductor can be used for the second transistor 74 and the third transistor 76. Alternatively, a transistor including a silicon semiconductor can be used for the second transistor 74 and the third transistor 76.

When the SAVE is set to the "H" level as shown in FIG. 16, the first transistor 70 is turned on. A source potential of the first transistor 70 is at the "H" level or at the "L" level according to the data of the register 203 to be held, and in accordance with the potential, a potential of the node F1 is set to the "H" level or at the "L" level. Then, the potential can be written to the capacitor 72. When the SAVE is set to the "L" level, the first transistor 70 is turned off, so that the data can be stored in the capacitor 72.

When the LOAD is set to the "H" level as shown in FIG. 16, the third transistor 76 is turned on. The second transistor 74 is turned on depending on the potential of the node F1. When the second transistor 74 and the third transistor 76 are turned on, the stored data can be loaded to the register 203.

As described above, a transistor including an oxide semiconductor can be used for the second memory. In a circuit including a transistor with an oxide semiconductor, there is neither deterioration of an insulating film due to data writing nor limitation of the number of writing, unlike a flash memory. Since the off-state current of the first transistor 70 is extremely small, the data stored in the capacitor 72 can be held for a long period.

Embodiment 3

In this embodiment, a structure of a semiconductor device of one embodiment of the present invention is described with reference to drawings.

<Example of Cross-Sectional Structure of Semiconductor Device>

Figure 5:
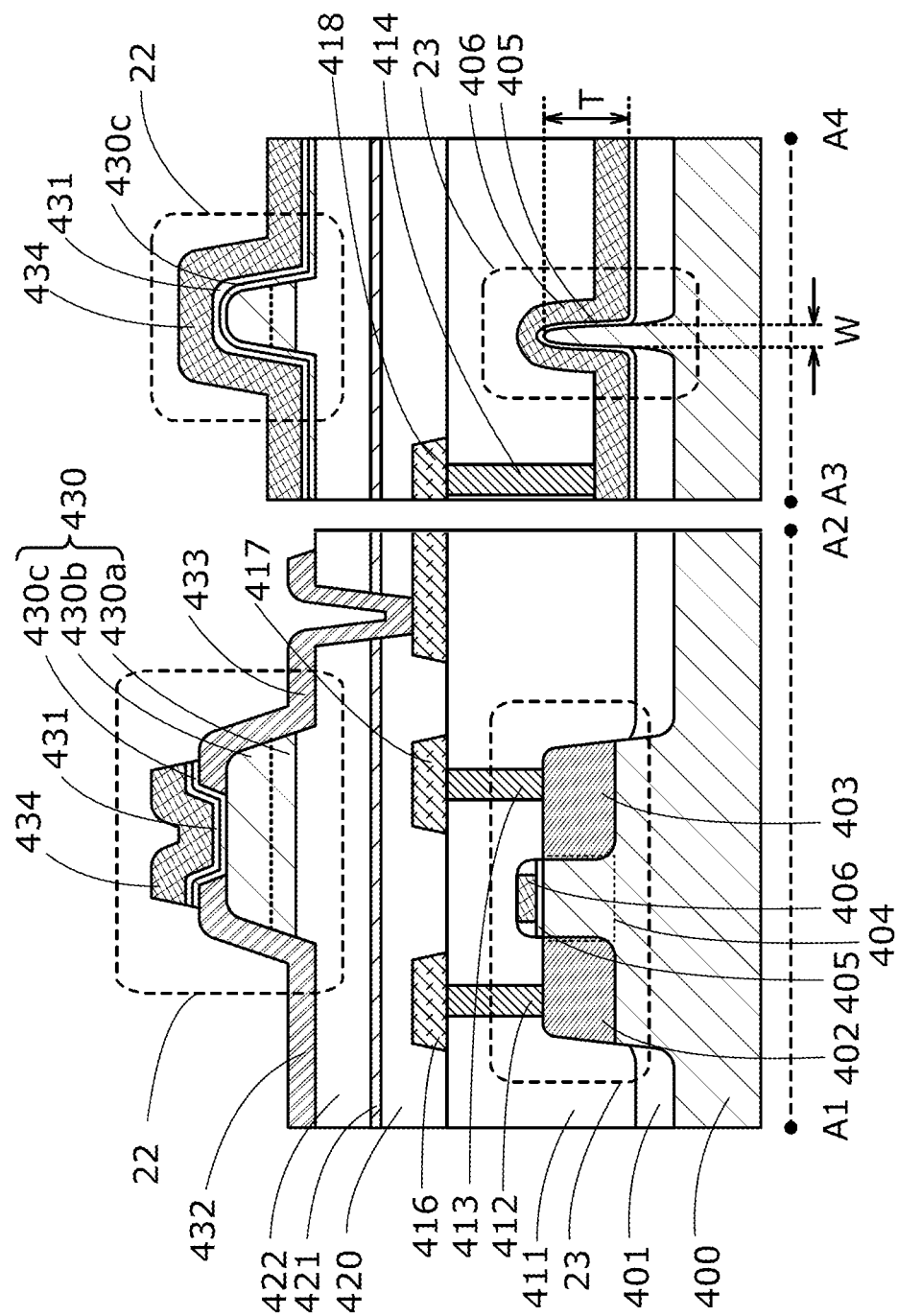
FIG. 5 illustrates a structure of a semiconductor device of one embodiment.

FIG. 5 illustrates a cross-sectional structure of the switch SW21-22 shown in FIG. 2 and FIG. 3 as an example. A transistor 23 in FIG. 5 can be used as the second transistor M22 and the fifth transistor M25 in FIG. 3, for example. A transistor 22 in FIG. 5 can be used as the first transistor M21 and the fourth transistor M24 in FIG. 3, for example.

In FIG. 5, a region along dashed line A1-A2 shows a structure of the transistors 22 and 23 in the channel length direction, and a region along dashed line A3-A4 shows a structure of the transistors 22 and 23 in the channel width direction. In one embodiment of the present invention, the channel length direction of the transistor 22 is not necessarily aligned with the channel length direction of the transistor 23.

The channel length direction denotes a direction in which carriers move through the shortest distance between a pair of impurity regions serving as a source region and a drain region. The channel width direction denotes a direction perpendicular to the channel length direction in a plane parallel to a substrate.

In FIG. 5, the transistor 22 including a channel formation region in an oxide semiconductor film is formed over the transistor 23 including a channel formation region in a single crystal silicon substrate.

The transistor 23 may include the channel formation region in a semiconductor film or a semiconductor substrate of silicon, germanium, or the like in an amorphous, microcrystalline, polycrystalline, or single crystal state. Alternatively, the transistor 23 may include the channel formation region in an oxide semiconductor film or an oxide semiconductor substrate. In the case where channel formation regions of all the transistors are included in an oxide semiconductor film or an oxide semiconductor substrate, the transistor 22 is not necessarily stacked over the transistor 23, and the transistors 22 and 23 may be formed in the same layer.

In the case where the transistor 23 is formed using a thin silicon film, any of the following can be used for the thin film: amorphous silicon formed by sputtering or vapor phase growth such as plasma CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the transistor 23 is formed can be, for example, a silicon substrate, a germanium substrate, or a silicon germanium substrate. In FIG. 5, a single crystal silicon substrate is used as the substrate 400.

The transistor 23 is electrically isolated from other elements by an element isolation method. As the element isolation method, a trench isolation method (a shallow trench isolation (STI) method) or the like can be used. FIG. 5 illustrates an example where the trench isolation method is used to electrically isolate the transistor 23. Specifically, in FIG. 5, the transistor 23 is electrically isolated by element isolation using an element isolation region 401 formed in such a manner that an insulator including silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the transistor 23 and a channel formation region 404 placed between the impurity regions 402 and 403 are provided. Furthermore, the transistor 23 includes an insulating film 405 covering the channel formation region 404, and a gate electrode 406 that overlaps with the channel formation region 404 with the insulating film 405 provided therebetween.

In the transistor 23, a side portion and an upper portion of the projection in the channel formation region 404 overlap with the gate electrode 406 with the insulating film 405 positioned therebetween, so that carriers flow in a wide area (including the side portion and the upper portion of the channel formation region 404). Thus, the number of transferred carriers in the transistor 23 can be increased while an area over the substrate occupied by the transistor 23 is reduced. As a result, the on-state current of the transistor 23 is increased and the field-effect mobility of the transistor 23 is increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor 23 can be further increased and the field-effect mobility of the transistor 23 can be further increased.

Note that in the case of the transistor 23 formed using a bulk semiconductor substrate, the aspect ratio is preferably 0.5 or higher, more preferably 1 or higher.

An insulating film 411 is provided over the transistor 23. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having a blocking effect of preventing diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed of, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed of, for example, silicon nitride or silicon nitride oxide.

An insulating film 422 is provided over the insulating film 421, and the transistor 22 is provided over the insulating film 422.

The transistor 22 includes, over the insulating film 422, a semiconductor film 430 containing an oxide semiconductor, conductive films 432 and 433 that are electrically connected to the semiconductor film 430 and function as source and drain electrodes, a gate insulating film 431 covering the semiconductor film 430, and a gate electrode 434 that overlaps the semiconductor film 430 with the gate insulating film 431 positioned therebetween. Note that an opening is formed in the insulating films 420 to 422. The conductive film 433 is connected to the conductive film 418 in the opening.

Note that in FIG. 5, the transistor 22 includes at least the gate electrode 434 on one side of the semiconductor film 430, and may further include a gate electrode overlapping with the semiconductor film 430 with the insulating film 422 positioned therebetween.

In the case where the transistor 22 has a pair of gate electrodes, one of the gate electrodes may be supplied with a signal for controlling the on/off state, and the other of the gate electrodes may be supplied with a potential from another element. In this case, potentials at the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 5, the transistor 22 has a single-gate structure where one channel formation region corresponding to one gate electrode 434 is provided. However, the transistor 22 may have a multi-gate structure in which a plurality of electrically connected gate electrodes is provided so that a plurality of channel formation regions is included in one active layer.

FIG. 5 illustrates an example in which the semiconductor film 430 included in the transistor 22 includes oxide semiconductor films 430a to 430c that are stacked in this order over the insulating film 422. Note that in one embodiment of the present invention, the semiconductor film 430 of the transistor 22 may be formed using a single-layer metal oxide film.

<Transistor>

Next, the description is made on a structural example of a transistor 22 having a channel formation region in an oxide semiconductor film.

Figure 6A:
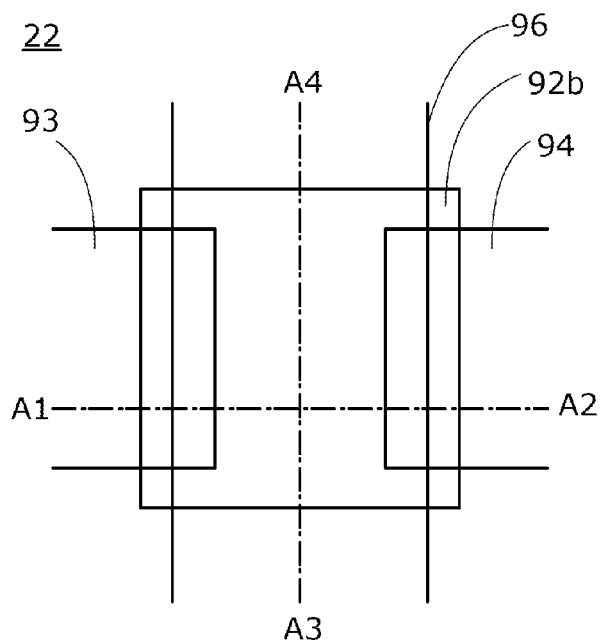
FIGS. 6A, 6B and 6C illustrate a structure of a semiconductor device of one embodiment.
Figure 6C:
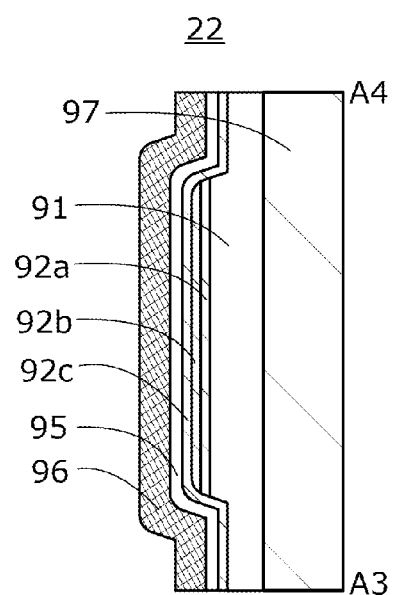
Figure 6B:
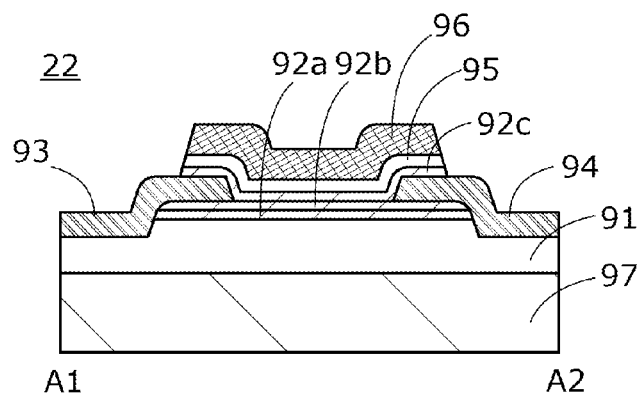

FIGS. 6A to 6C illustrate a structure example of the transistor 22 having a channel formation region in an oxide semiconductor film. FIG. 6A is the top view of the transistor 22. Note that insulating films are not illustrated in FIG. 6A in order to clarify the layout of the transistor 22. FIG. 6B is a cross-sectional view along the dashed line A1-A2 in the top view in FIG. 6A. FIG. 6C is a cross-sectional view along the dashed line A3-A4 in the top view in FIG. 6A.

As illustrated in FIG. 6A to 6C, the transistor 22 includes an oxide semiconductor film 92a and an oxide semiconductor film 92b that are stacked in this order over an insulating film 91 formed over an insulating surface 97; a conductive film 93 and a conductive film 94 that are electrically connected to the oxide semiconductor film 92b and function as a source electrode and a drain electrode; an oxide semiconductor film 92c over the oxide semiconductor film 92b, the conductive film 93, and the conductive film 94; an insulating film 95 that functions as a gate insulating film and is located over the oxide semiconductor film 92c; and a conductive film 96 that functions as a gate electrode, lies over the insulating film 95, and overlaps with the oxide semiconductor films 92a to 92c. Note that the insulating surface 97 may be a surface of a glass substrate, a semiconductor substrate, or the like or may be a surface of an element substrate where semiconductor elements are formed over a glass substrate or on a semiconductor substrate.

Figure 7A:
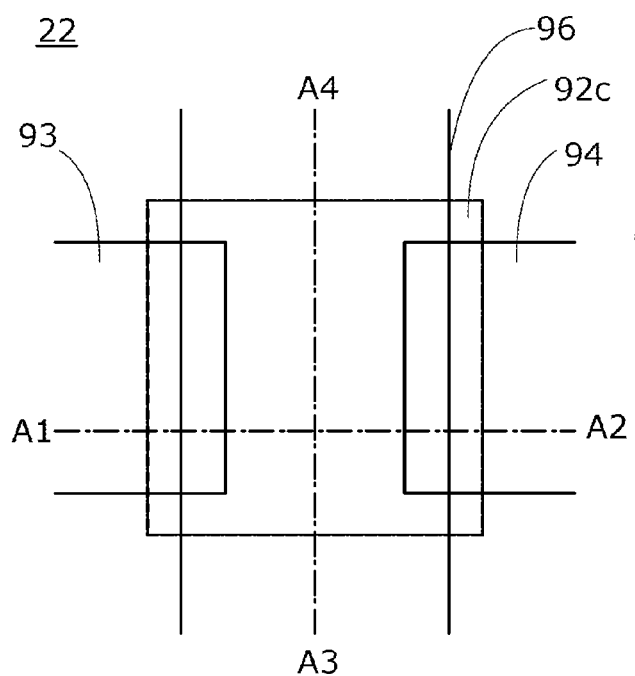
FIGS. 7A, 7B and 7C illustrate a structure of a semiconductor device of one embodiment.
Figure 7C:
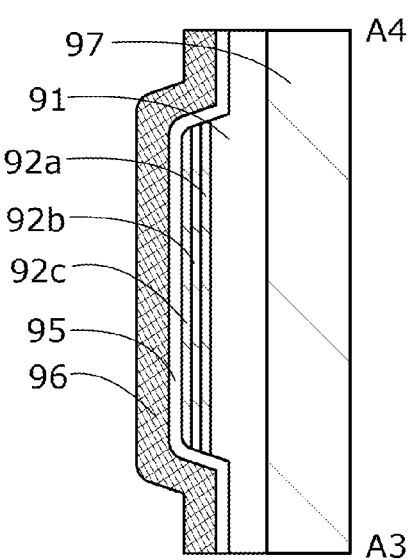
Figure 7B:
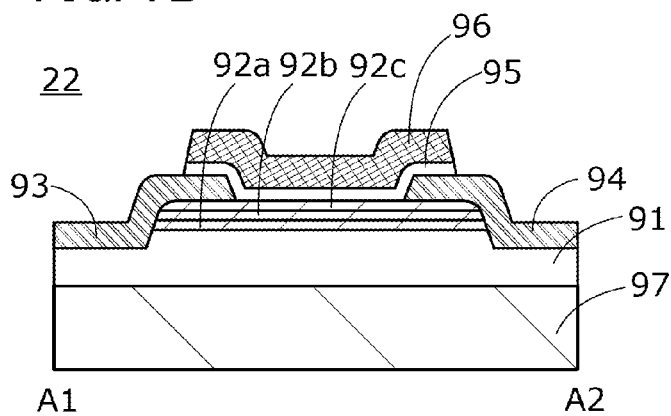

FIGS. 7A to 7C illustrates another specific example of the structure of the transistor 22. FIG. 7A is the top view of the transistor 22. Note that insulating films are not illustrated in FIG. 7A in order to clarify the layout of the transistor 22. FIG. 7B is a cross-sectional view along the dashed line A1-A2 in the top view in FIG. 7A. FIG. 7C is a cross-sectional view along the dashed line A3-A4 in the top view in FIG. 7A.

As illustrated in FIGS. 7A to 7C, the transistor 22 includes the oxide semiconductor films 92a to 92c that are stacked in this order over the insulating film 91; the conductive films 93 and 94 that are electrically connected to the oxide semiconductor film 92c and function as a source electrode and a drain electrode; the insulating film 95 that functions as a gate insulating film and is located over the oxide semiconductor film 92c and the conductive films 93 and 94; and the conductive film 96 that functions as a gate electrode, lies over the insulating film 95, and overlaps with the oxide semiconductor films 92a to 92c.

FIGS. 6A to 6C and FIGS. 7A to 7C each illustrate the structure example of the transistor 22 in which the oxide semiconductor films 92a to 92c are stacked. However, the structure of the oxide semiconductor film included in the transistor 22 is not limited to a stacked-layer structure including a plurality of oxide semiconductor films and may be a single-layer structure.

In the case where the transistor 22 includes the semiconductor film in which the oxide semiconductor films 92a to 92c are stacked in this order, each of the oxide semiconductor films 92a and 92c is an oxide film that contains at least one of metal elements contained in the oxide semiconductor film 92b and in which energy at the conduction band minimum is closer to the vacuum level than that in the oxide semiconductor film 92b is by higher than or equal to 0.05 eV, 0.07 eV, 0.1 eV, or 0.15 eV and lower than or equal to 2 eV, 1 eV, 0.5 eV, or 0.4 eV. The oxide semiconductor film 92b preferably contains at least indium because carrier mobility is increased.

In the case where the transistor 22 includes the semiconductor films with the above structure, when an electric field is applied to the semiconductor films by applying voltage to the gate electrode, a channel region is formed in the oxide semiconductor film 92b, which has the lowest conduction band minimum among the semiconductor films. That is, since the oxide semiconductor film 92c is provided between the oxide semiconductor film 92b and the insulating film 95, a channel region can be formed in the oxide semiconductor film 92b, which is separated from the insulating film 95.

Since the oxide semiconductor film 92c contains at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which results in an increase in the field-effect mobility of the transistor 22.

When an interface state is formed at an interface between the oxide semiconductor films 92b and 92a, a channel region is also formed in a region close to the interface; thus, the threshold voltage of the transistor 22 varies. However, since the oxide semiconductor film 92a contains at least one of metal elements contained in the oxide semiconductor film 92b, an interface state is unlikely to be formed at the interface between the oxide semiconductor film 92b and the oxide semiconductor film 92a. Accordingly, the above structure allows reducing of variations in the electrical characteristics of the transistor 22, such as the threshold voltage.

Further, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the continuity of the energies of the conduction band minima of the oxide semiconductor films is lost, and carriers are trapped or disappear by recombination in the vicinity of the interface. By reducing an impurity existing between the films, a continuous junction (here, in particular, a well structure having a U shape in which energies of the conduction band minima are changed continuously between the films) is formed easily as compared with the case of merely stacking the plurality of oxide semiconductor films which contain at least one common metal as a main component.

In order to form such a continuous junction, it is necessary to form films continuously without being exposed to air, with use of a multi-chamber deposition apparatus (sputtering apparatus) including a load lock chamber. Each chamber of the sputtering apparatus is preferably evacuated to a high vacuum (to about $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of $-40°$ C. or lower, preferably $-80°$ C. or lower, further preferably $-100°$ C. or lower and is highly purified, moisture and the like can be prevented from entering the oxide semiconductor film as much as possible. Specifically, in the case where the oxide semiconductor film 92b is an In—M—Zn oxide film (M represents Ga, Y, Zr, La, Ce, or Nd) and a target having the atomic ratio of metal elements of In:M:Zn=$x_1$:$y_1$:$z_1$ is used for forming the oxide semiconductor film 92b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 92b is easily formed. Typical examples of the atomic ratio of the metal elements of the target are In:M:Zn=1:1:1, In:M:Zn=3:1:2, and the like.

Specifically, in the case where the oxide semiconductor film 92a and the oxide semiconductor film 92c are an In—M—Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor films 92a and 92c, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 92a and 92c. Typical examples of the atomic ratio of the metal elements of the target are In:M:Zn=1:3:2, In:M:Zn=1:3:4, In:M:Zn=1:3:6, In:M:Zn=1:3:8, and the like.

The oxide semiconductor film 92a and the oxide semiconductor film 92c each have a thickness of more than or equal to 3 nm and less than or equal to 100 nm, preferably more than or equal to 3 nm and less than or equal to 50 nm. The thickness of the oxide semiconductor film 92b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the three oxide semiconductor films 92a to 92c can be either amorphous or crystalline. Note that the oxide semiconductor film 92b in which a channel region is formed preferably has a crystalline structure, so that the transistor 22 can have stable electrical characteristics.

Note that a channel formation region refers to a region of a semiconductor film of the transistor 22 that overlaps with a gate electrode and is located between a source electrode and a drain electrode. Furthermore, a channel region refers to a region through which current mainly flows in the channel formation region.

For example, when an In—Ga—Zn oxide film formed by a sputtering method is used as each of the oxide semiconductor films 92a and 92c, the oxide semiconductor films 92a and 92c can be deposited with the use of an In—Ga—Zn oxide target having an atomic ratio of In:Ga:Zn=1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Furthermore, when the oxide semiconductor film 92b is a CAAC-OS film, the oxide semiconductor film 92b is preferably deposited with the use of a polycrystalline In—Ga—Zn oxide target having an atomic ratio of In:Ga:Zn=1:1:1. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Although the oxide semiconductor films 92a to 92c can be formed by a sputtering method, they may be formed by another method, e.g., a thermal CVD method. A metal organic chemical vapor deposition (MOCVD) method or an atomic layer deposition (ALD) method may be given as an example of the thermal CVD method.

There are few carrier generation sources in a highly purified oxide semiconductor obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove a small off-state current of a transistor having a channel formation region in a highly purified oxide semiconductor. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{-13}$ A, at voltage (drain voltage) between the source electrode and the drain electrode of from 1 V to 10 V. In that case, it can be seen that off-state current standardized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly purified oxide semiconductor film was used for a channel formation region of the transistor, and the off-state current of the transistor was measured from a change in the amount of electrical charge of the capacitor per unit hour. As a result, it was found that, in the case where the voltage between the source electrode and the drain electrode of the transistor is 3 V, a lower off-state current of several tens of yA/μm is obtained. Accordingly, the off-state current of the transistor in which the highly purified oxide semiconductor film is used as a channel formation region is considerably lower than that of a transistor in which silicon having crystallinity is used.

In the case where an oxide semiconductor film is used as the semiconductor film, at least indium (In) or zinc (Zn) is preferably included in an oxide semiconductor. The oxide semiconductor preferably contains, in addition to In and Zn, gallium (Ga) serving as a stabilizer that reduces variations in electric characteristics of the transistor using the above-described oxide semiconductor film. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

An In—Ga—Zn oxide and an In—Sn—Zn oxide among oxide semiconductors have the following advantages over silicon carbide, gallium nitride, and gallium oxide: transistors with excellent electrical characteristics can be formed by a sputtering method or a wet process and thus can be mass-produced easily. Further, unlike silicon carbide, gallium nitride, or gallium oxide, with the use of the In—Ga—Zn oxide, a transistor with favorable electrical characteristics can be formed over a glass substrate. Furthermore, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio between In, Ga, and Zn. Further, the In—Ga—Zn-based oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reduction in the defect density in a bulk.

Furthermore, in the transistor 22, a metal in the source electrode and the drain electrode might extract oxygen from the oxide semiconductor film depending on a conductive material used for the source electrode and the drain electrode. In such a case, a region of the oxide semiconductor film in contact with the source electrode or the drain electrode becomes an n-type region due to the formation of an oxygen vacancy. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 22, achieving the high-speed operation of a semiconductor device using the transistor 22.

A transistor that can operate at high speed can be used as the transistor 23 in FIG. 5. When the transistor 23 also includes an oxide semiconductor film, the transistor 23 is preferably formed in the same layer as the transistor 22. That is, a film of an oxide semiconductor layer etched from the same starting film constitutes the transistors 22 and 23. Note that when the transistor 22 including an oxide semiconductor film is formed over the transistor 23 including an oxide semiconductor film, the degree of integration can be increased.

In addition, since the signal-transmission speed can be increased according to one embodiment of the present invention, even a transistor including an oxide semiconductor film that does not have an n-type region may be used as the transistor 23 in FIG. 5.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material which is easily bonded to oxygen. Examples of such a conductive material include Al, Cr, Cu, Ta, Ti, Mo, and W.

Furthermore, in the case where the semiconductor film including the stacked oxide semiconductor films is used in the transistor 22, the n-type region preferably extends to the oxide semiconductor film 92*b* serving as a channel region in order that the mobility and on-state current of the transistor 22 can be further increased and the semiconductor device can operate at higher speed.

The insulating film 91 preferably has a function of supplying part of oxygen to the oxide semiconductor films 92*a* to 92*c* by heating. It is preferable that the number of defects in the insulating film 91 be small, and typically the spin density of g=2.001 due to a dangling bond of silicon be lower than or equal to $1\times10^{18}$ spins/cm$^3$. The spin density is measured by electron spin resonance (ESR) spectroscopy.

The insulating film 91, which has a function of supplying part of oxygen to the oxide semiconductor films 92*a* to 92*c* by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 91 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 22 illustrated in FIGS. 6A to 6C or FIGS. 7A to 7C, the conductive film 96 overlaps with end portions of the oxide semiconductor film 92*b* including a channel region that do not overlap with the conductive films 93 and 94, i.e., end portions of the oxide semiconductor film 92*b* that are in a region different from a region where the conductive films 93 and 94 are located. When the end portions of the oxide semiconductor film 92*b* are exposed to plasma by etching for forming the end portions, a chlorine radical, a fluorine radical, or other radicals generated from an etching gas are easily bonded to a metal element contained in the oxide semiconductor. For this reason, in the end portion of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the potential of the conductive film 96 because the end portions of the oxide semiconductor film 92*b* that do not overlap with the conductive films 93 and 94 overlap with the conductive film 96 in the transistor 22 illustrated in FIGS. 6A to 6C or FIGS. 7A to 7C. Consequently, current that flows between the conductive films 93 and 94 through the end portions of the oxide semiconductor film 92*b* can be controlled by the potential applied to the conductive film 96. Such a transistor structure is referred to as a surrounded channel (s-channel) structure.

With the s-channel structure, specifically, when a potential at which the transistor 22 is turned off is supplied to the conductive film 96, the amount of off-state current that flows between the conductive films 93 and 94 through the end portions can be reduced. For this reason, in the transistor 22, even when the distance between the conductive films 93 and 94 at the end portions of the oxide semiconductor film 92*b* is reduced as a result of reducing the channel length to obtain high on-state current, the transistor 22 can have low off-state current. Consequently, with the short channel length, the transistor 22 can have high on-state current when in an on state and low off-state current when in an off state.

With the s-channel structure, specifically, when a potential at which the transistor 22 is turned on is supplied to the conductive film 96, the amount of current that flows between the conductive films 93 and 94 through the end portions can be increased. The current contributes to an increase in the field-effect mobility and the on-state current of the transistor 22. When the end portions of the oxide semiconductor film 92*b* overlap with the conductive film 96, carriers flow in a wide region of the oxide semiconductor film 92*b* without being limited to a region in the vicinity of the interface of the oxide semiconductor film 92*b* close to the insulating film 95, which results in an increase in the amount of carrier movement in the transistor 22. As a result, the on-state current of the transistor 22 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is an index of current drive capability and the apparent field-effect mobility of a saturation region of the transistor.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ does not appear at around 36°.

In a transistor including the CAAC-OS film, a change in electrical characteristics due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS layer during the deposition, the crystal state can be prevented from being broken by the impurities. For example, the concentration of impurities (e.g., hydrogen, water, carbon dioxide, and nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like (pellet-like) sputtered particles reach the substrate, migration occurs on the substrate, so that a flat plane of each flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the target, an In—Ga—Zn oxide target is described below.

The In—Ga—Zn oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder, $GaO_Y$ powder, and $ZnO_Z$ powder is, for example, 2:2:1, 8:4:3, 3:1:1, 1:1:1, 4:2:3, 2:1:3, or 3:1:2. The kinds of powder and the molar ratio for mixing powder may be determined as appropriate depending on the desired target. In particular, when a CAAC-OS film is formed using a target with a molar ratio of In:Ga:Zn=2:1:3, a proportion of a region where a diffraction pattern of CAAC-OS is observed in a certain area (proportion of CAAC) can be increased. Therefore, frequency characteristics (f characteristics) can be improved.

An alkali metal is not an element included in an oxide semiconductor and thus is an impurity. Also, alkaline earth metal is an impurity in the case where the alkaline earth metal is not a component of the oxide semiconductor. Alkali metal, in particular, Na becomes $Na^+$ when an insulating film in contact with the oxide semiconductor film is an oxide and Na diffuses into the insulating film. Further, in the oxide semiconductor film, Na cuts or enters a bond between metal and oxygen which are included in the oxide semiconductor. As a result, for example, degradation of electrical characteristics of a transistor, such as a normally-on state of the transistor due to shift of the threshold voltage in the negative direction or reduction in mobility, occurs. In addition, variations in electrical characteristics also occurs. Specifically, the Na concentration according to secondary ion mass spectrometry is reduced to preferably less than or equal to $5×10^{16}/cm^3$, further preferably less than or equal to $1×10^{16}/cm^3$, still further preferably less than or equal to $1×10^{15}/cm^3$. In a similar manner, the measurement value of Li concentration is preferably less than or equal to $5×10^{15}/cm^3$, more preferably less than or equal to $1×10^{15}/cm^3$. In a similar manner, the measurement value of K concentration is preferably less than or equal to $5×10^{15}/cm^3$, more preferably less than or equal to $1×10^{15}/cm^3$.

In the case where a metal oxide containing indium is used, silicon or carbon having higher bond energy with oxygen than indium might cut the bond between indium and oxygen, so that an oxygen vacancy is formed. Accordingly, when silicon or carbon is contained in the oxide semiconductor film, the electric characteristics of the transistor are likely to deteriorate as in the case of an alkali metal or an alkaline earth metal. Thus, the concentration of silicon and the concentration of carbon in the oxide semiconductor film are preferably low. Specifically, the C concentration or the Si concentration measured by secondary ion mass spectrometry is preferably less than or equal to $1×10^{18}/cm^3$. In this case, the deterioration of the electric characteristics of the transistor can be prevented, so that the reliability of a semiconductor device can be improved.

<Example of Cross-Sectional Structure of Semiconductor Device>

Figure 8:
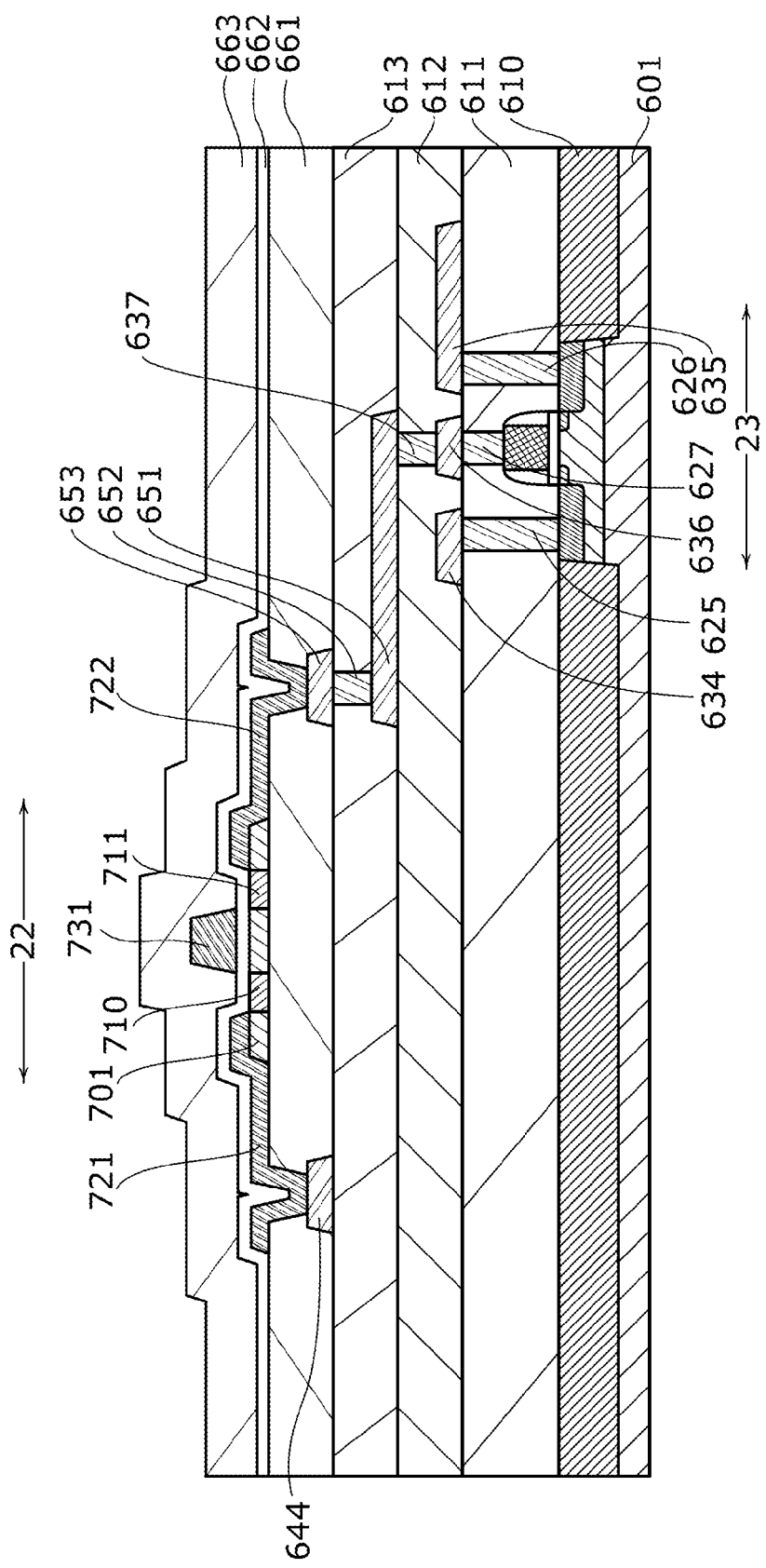
FIG. 8 illustrates a structure of a semiconductor device of one embodiment.

FIG. 8 illustrates a cross-sectional structure of the switch SW21-11 shown in FIG. 2 and FIG. 3 as an example.

In FIG. 8, the transistor 22 including a channel formation region in an oxide semiconductor film is formed over the transistor 23 including a channel formation region in a single crystal silicon substrate.

The transistor 23 may include the channel formation region in a semiconductor film or a semiconductor substrate of silicon, germanium, or the like in an amorphous, microcrystalline, polycrystalline, or single crystal state. Alternatively, the transistor 23 may include the channel formation region in an oxide semiconductor film or an oxide semiconductor substrate. In the case where channel formation regions of all the transistors are included in an oxide semiconductor film or an oxide semiconductor substrate, the transistor 22 is not necessarily stacked over the transistor 23, and the transistors 22 and 23 may be formed in the same layer.

In the case where the transistor 23 is formed using a thin silicon film, any of the following can be used for the thin film: amorphous silicon formed by sputtering or vapor phase growth such as plasma CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 601 where the transistor 23 is formed can be, for example, a silicon substrate, a germanium substrate, or a silicon germanium substrate. In FIG. 8, a single crystal silicon substrate is used as the semiconductor substrate 601.

The transistor 23 is electrically isolated from other elements by an element isolation method. As the element isolation method, a local oxidation of silicon (LOCOS) method, a shallow trench isolation (STI) method, or the like can be employed. In FIG. 8, the transistor 23 is electrically isolated by trench isolation. Specifically, in FIG. 8, the transistor 23 is electrically isolated by element isolation using an element isolation region 610 formed in such a manner that an insulator including silicon oxide or the like is buried in a trench formed in the semiconductor substrate 601 by etching or the like.

An insulating film 611 is provided over the transistor 23. Openings are formed in the insulating film 611. Conductive films 625 and 626 that are electrically connected to the source and drain of the transistor 23 and a conductive film 627 that is electrically connected to the gate of the transistor 23 are formed in the openings.

The conductive film 625 is electrically connected to a conductive film 634 formed over the insulating film 611. The conductive film 626 is electrically connected to a conductive film 635 formed over the insulating film 611. The conductive film 627 is electrically connected to a conductive film 636 formed over the insulating film 611.

An insulating film 612 is formed over the conductive films 634 to 636. An opening is formed in the insulating film 612. A conductive film 637 electrically connected to the conductive film 636 is formed in the opening. The conductive film 637 is electrically connected to a conductive film 651 formed over the insulating film 612.

An insulating film 613 is formed over the conductive film 651. An opening is formed in the insulating film 613. A conductive film 652 electrically connected to the conductive film 651 is formed in the opening. The conductive film 652 is electrically connected to a conductive film 653 formed over the insulating film 613. A conductive film 644 is formed over the insulating film 613.

An insulating film 661 is formed over the conductive film 653 and the conductive film 644. In FIG. 8, the transistor 22 is formed over the insulating film 661.

The transistor 22 includes, over the insulating film 661, a semiconductor film 701 including an oxide semiconductor, conductive films 721 and 722 functioning as source and drain electrodes over the semiconductor film 701, a gate insulating film 662 over the semiconductor film 701 and the conductive films 721 and 722, and a gate electrode 731 overlapping with the semiconductor film 701 over the gate insulating film 662 and between the conductive films 721 and 722. Note that the conductive film 722 is electrically connected to the conductive film 653 in the opening formed in the insulating film 661.

In the semiconductor film 701 of the transistor 22, there is a region 710 between a region overlapping with the conductive film 721 and a region overlapping with the gate electrode 731. In addition, in the semiconductor film 701 of the transistor 22, there is a region 711 between a region overlapping with the conductive film 722 and the region overlapping with the gate electrode 731. When rare gas such as argon, an impurity which imparts p-type conductivity to the semiconductor film 701, or an impurity which imparts n-type conductivity to the semiconductor film 701 is added to the regions 710 and 711 using the conductive films 721 and 722 and the gate electrode 731 as a mask, the resistivity of the regions 710 and 711 can be made lower than that of the region overlapping with the gate electrode 731 in the semiconductor film 701.

An insulating film 663 is provided over the transistor 22.

In FIG. 8, the transistor 22 has the gate electrode 731 on at least one side of the semiconductor film 701; alternatively, the transistor 22 may have a pair of gate electrodes with the semiconductor film 701 positioned therebetween.

In the case where the transistor 22 has a pair of gate electrodes with the semiconductor film 701 positioned therebetween, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 8, the transistor 22 has a single-gate structure where one channel formation region corresponding to one gate electrode 731 is provided. However, the transistor 22 may have a multi-gate structure in which a plurality of electrically connected gate electrodes is provided so that a plurality of channel formation regions is included in one active layer.

<Example of Cross-Sectional Structure of Semiconductor Device>

Figure 18:
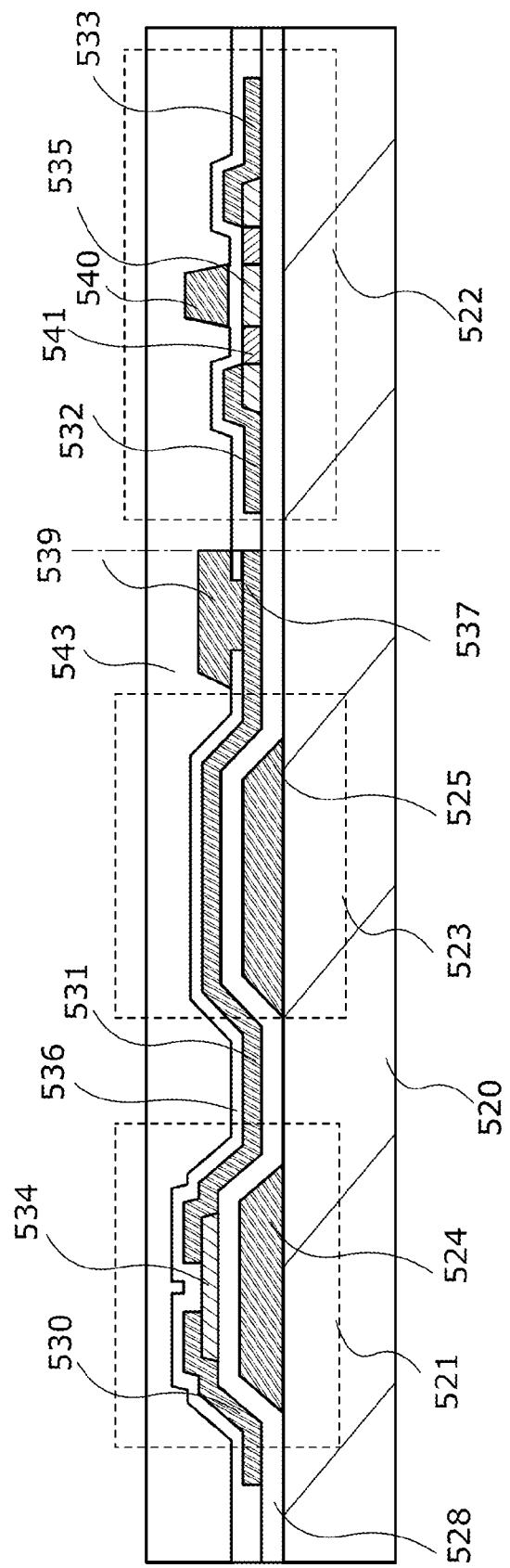
FIG. 18 illustrates a structure of a semiconductor device of one embodiment.

FIG. 18 illustrates a cross-sectional structure of the switch SW21-11 shown in FIG. 14 and FIG. 15 as an example.

FIG. 18 illustrates a cross sectional structure of the first transistor M31, the second transistor M32, and the first capacitor C31. The first transistor M31 has a bottom gate structure where a gate is under a semiconductor layer, and the second transistor M32 has a top gate structure where a gate is over a semiconductor layer.

A substrate 520 can have a structure similar to that of the above-mentioned substrate 400.

A transistor 521, a transistor 522, and a capacitor 523 are formed over the substrate 520. The transistor 521 corresponds to the first transistor M31. The transistor 522 corresponds to the second transistor M32. The capacitor 523 corresponds to the first capacitor C31.

A conductive film is formed over the substrate 520. The conductive film is processed into predetermined shapes, so that a first conductive layer 524 and a second conductive layer 525 are formed. The first conductive layer 524 can function as a gate of the transistor 521. The second conductive layer 525 can function as one of electrodes of the capacitor 523. These layers are formed from the same starting conductive film. The conductive layers may include a material similar to the above-described conductive material.

An insulating film 528 is formed over the first conductive layer 524 and the second conductive layer 525. The insulating film 528 has a region functioning as a gate insulating film in the transistor 521, a region functioning as dielectric in the capacitor 523, and a region functioning as a base film in the transistor 522. For the insulating film 528, aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, or the like can be used.

A semiconductor film is formed over the insulating film 528. The semiconductor film is processed into predetermined shapes, so that a first semiconductor layer 534 and the second semiconductor layer 535 are formed. The first semiconductor layer 534 includes at least a region to be a channel formation region of the transistor 521. The second semiconductor layer 535 includes at least a region to be a channel formation region of the transistor 522. The semiconductor film can have a structure similar to the above-mentioned oxide semiconductor film. Application of a CAAC-OS film to the semiconductor film is preferred at least for the first transistor M31 because of the extremely small off-state current.

A conductive film is formed over the semiconductor layers. The conductive film is processed into predetermined shapes, so that a third conductive layer 530, a fourth conductive layer 531, a fifth conductive layer 532, and a sixth conductive layer 533 are formed. The third conductive layer 530 can function as one of a source and a drain of the transistor 521. The fourth conductive layer 531 can function as the other of the source and drain of the transistor 521. The fourth conductive layer 531 can function as the other of electrodes of the capacitor 523. The fifth conductive layer 532 can function as one of a source and a drain of the transistor 522. The sixth conductive layer 533 can function as the other of the source and drain of the transistor 522. These layers are formed from the same starting conductive film. The conductive film can include a material similar to the above-described conductive material.

An insulating film 536 is formed over the third conductive layer 530 to the sixth conductive layer 533. The insulating film 536 can function as a protection film in the transistor 521. The insulating film 536 can function as a gate insulating film in the transistor 522. For the insulating film 536, aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, or the like can be used.

An opening 537 is formed in the insulating film 536.

A conductive film is formed over the insulating film 536. The conductive film is processed into predetermined shapes, so that a seventh conductive layer 539 and an eighth conductive layer 540 are formed. The seventh conductive layer 539 can function as a wiring electrically connecting one of the source and drain of the transistor 521 to a gate of the transistor 522. The eighth conductive layer 540 can function as the gate of the transistor 522. These layers are formed from the same starting conductive film. The conductive layers can include a material similar to the above-described conductive material.

In the transistor 522, elements may be added to the semiconductor layer 535 with the use of at least the fifth conductive layer 532, the sixth conductive layer 533, and the eighth conductive layer 540 as masks. For the elements, rare gas such as argon, phosphorus, boron, or the like can be used. A region 541 to which the elements are added has lower resistance than a region to which no element is added. Accordingly, the on-state current of the transistor 522 can be improved.

An insulating film 543 is formed over the seventh conductive layer 539 and the eighth conductive layer 540. For the insulating film 543, aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, or the like can be used.

Such a structure can be applied to the first transistor M31, the second transistor M32, and the first capacitor C31, and similarly, can be applied to the fourth transistor M34, the fifth transistor M35, and the second capacitor C32.

<Examples of Electronic Device>

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can include the semiconductor device according to one embodiment of the present invention are mobile phones, game machines including portable game machines, personal digital assistants, e-book readers, video cameras, cameras such as digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. Specific examples of these electronic devices are shown in FIGS. 9A to 9F.

Figure 9A:
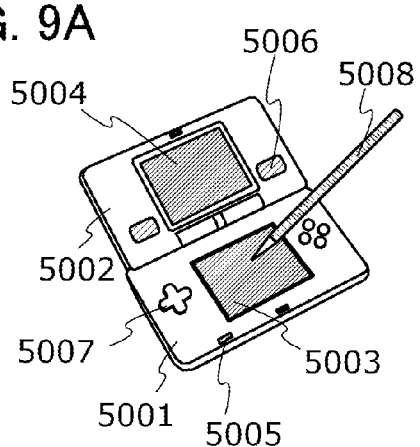
FIGS. 9A to 9F illustrate structures of electronic devices and the like of one embodiment.

FIG. 9A illustrates a portable game machine including a housing 5001, a housing 5002, a display portion 5003, a display portion 5004, a microphone 5005, speakers 5006, operation keys 5007, and a stylus 5008. The semiconductor device of one embodiment of the present invention can be used for a variety of integrated circuits included in portable game machines. Although the portable game machine in FIG. 9A has the two display portions 5003 and 5004, the number of display portions included in a portable game machine is not limited to this.

Figure 9B:
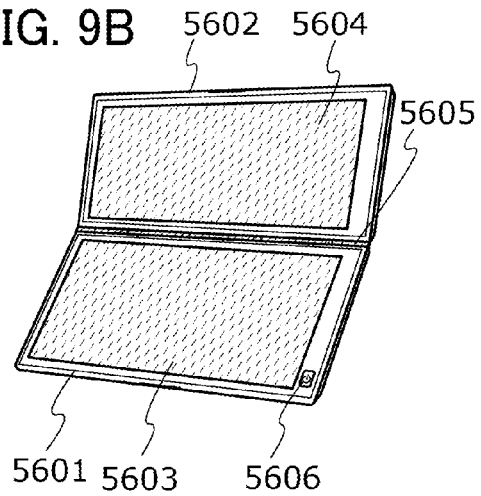

FIG. 9B illustrates a personal digital assistant, which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in personal digital assistant. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel area of a display device.

Figure 9C:
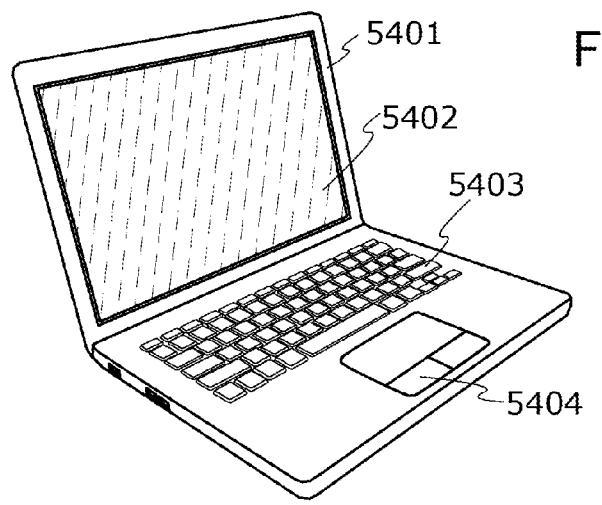

FIG. 9C illustrates a laptop personal computer, which includes a housing 5401, a display portion 5402, a keyboard 5403, a pointing device 5404, and the like. The semiconductor device of one embodiment of the present invention can be used for a variety of integrated circuits included in laptop personal computers.

Figure 9D:
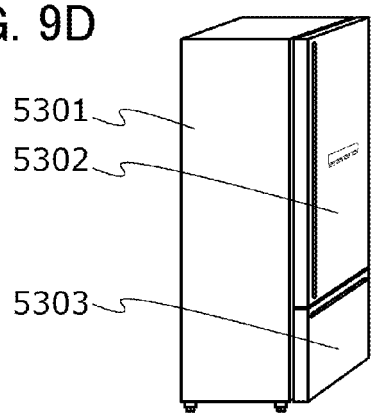

FIG. 9D illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 9E:
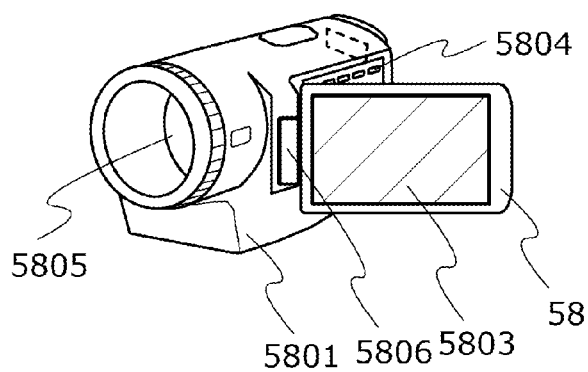

FIG. 9E illustrates a video camera, which includes a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 9F:
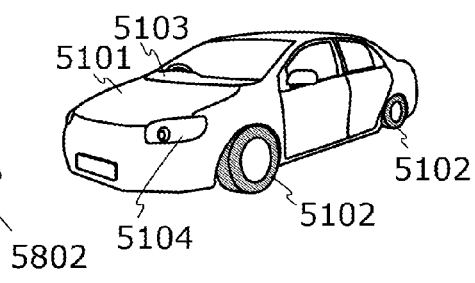
Figure 10:
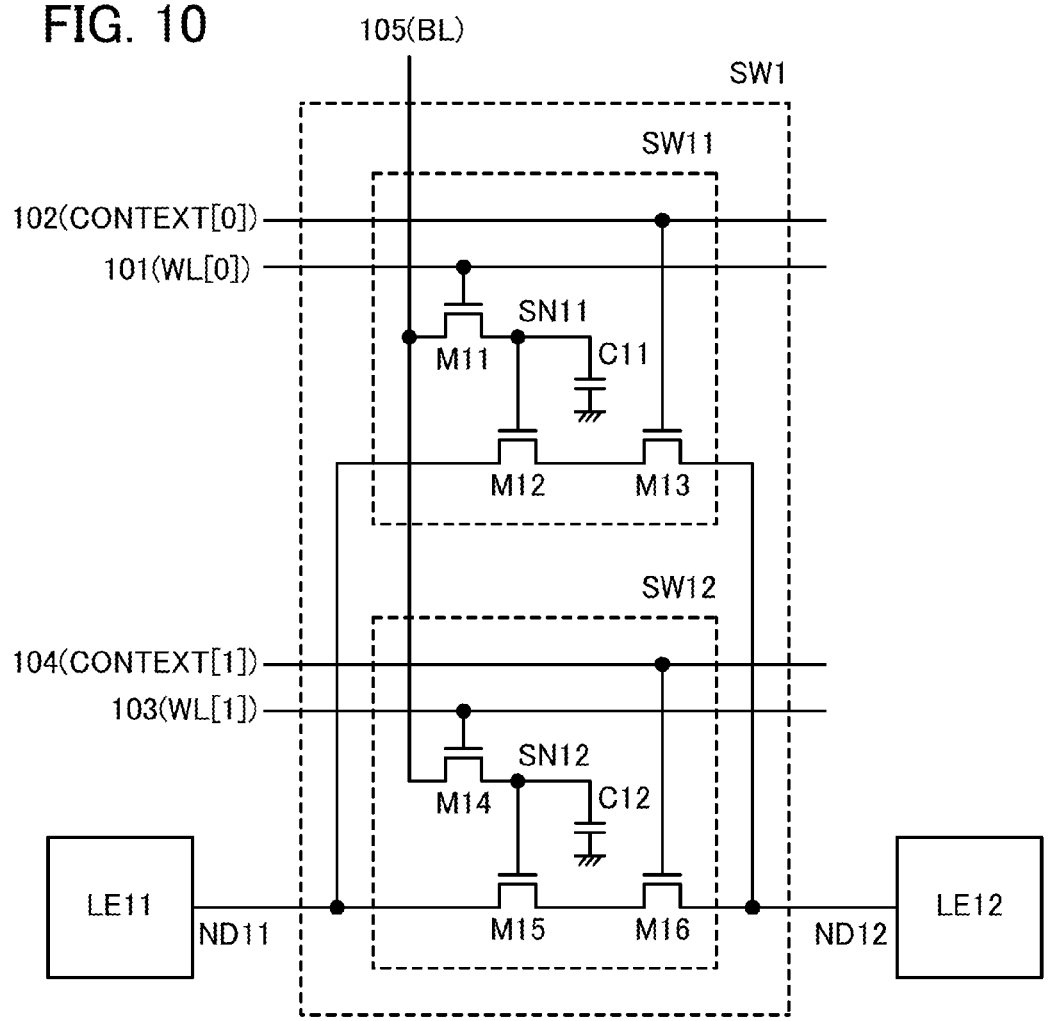
FIG. 10 illustrates a structure of a semiconductor device.

FIG. 9F illustrates a passenger car including a car body 5101, wheels 5102, a dashboard 5103, lights 5104, and the like. The semiconductor device of one embodiment of the present invention can be used for a variety of integrated circuits included in passenger cars.

<Others>

Note that in this specification and the like, when it is explicitly described that X and Y are connected, the case where X and Y are electrically connected, the case where X and Y are functionally connected, and the case where X and Y are directly connected are included therein. Accordingly, connection is not limited to a predetermined connection relation, for example, a connection relation shown in drawings and texts.

Here, X and Y each denote an object (e.g., a device, an element, a circuit, a wiring, an electrode, a terminal, a conductive film, a layer, or the like).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to control whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit, or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute one embodiment of the invention. Thus, in the case where a diagram or a text related to a certain portion is described, the context taken out from part of the diagram or the text is also disclosed as one embodiment of the invention, and one embodiment of the invention can be constituted. The embodiment of the present invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text can be taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M</V) from a flow chart in which N elements (N is an integer) are provided. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

This application is based on Japanese Patent Application serial no. 2014-043550 filed with Japan Patent Office on Mar. 6, 2014 and Japanese Patent Application serial no. 2014-049713 filed with Japan Patent Office on Mar. 13, 2014, the entire contents of which are hereby incorporated by reference.

What is claimed is:

1. A semiconductor device comprising:
a first logic element;
a first switch electrically connected to the first logic element; and
a second logic element electrically connected to the first switch,
wherein the first logic element comprises a second switch,
wherein the second switch is configured to set an output potential of the first logic element to a L level,
wherein the first switch comprises a first transistor, a second transistor, a third transistor, and a capacitor,
wherein a gate of the second transistor is electrically connected to one of a source and a drain of the first transistor,
wherein the gate of the second transistor is electrically connected to a first electrode of the capacitor,
wherein a gate of the first transistor is electrically connected to a first signal line,
wherein a gate of the third transistor is electrically connected to a second signal line, and
wherein the second signal line is configured to supply a signal for selecting one of contexts.

2. The semiconductor device according to claim 1, wherein the second switch is a logical conjunction circuit.

3. The semiconductor device according to claim 1, wherein the second switch is an AND circuit.

4. The semiconductor device according to claim 1, wherein the second transistor comprises an oxide semiconductor in a channel formation region.

5. A semiconductor device comprising:
a first logic element;
a switch electrically connected to the first logic element; and
a second logic element electrically connected to the switch,
wherein the first logic element comprises a memory electrically connected to a register,
wherein the memory is configured to hold data of the register,
wherein the register is configured to set an output potential to a L level after the memory holds the data,
wherein the switch comprises a first transistor, a second transistor, a third transistor, and a capacitor,
wherein a gate of the second transistor is electrically connected to one of a source and a drain of the first transistor,
wherein the gate of the second transistor is electrically connected to a first electrode of the capacitor,
wherein a gate of the first transistor is electrically connected to a first signal line,
wherein a gate of the third transistor is electrically connected to a second signal line, and
wherein the second signal line is configured to supply a signal for selecting one of contexts.

6. The semiconductor device according to claim 5, wherein the memory comprises a transistor comprising an oxide semiconductor layer.

7. The semiconductor device according to claim 5, wherein the second transistor comprises an oxide semiconductor in a channel formation region.

8. A semiconductor device comprising:
a first logic element comprising:
a register; and
a first switch configured to receive an output signal of the register;
a second switch configured to receive an output signal of the first switch; and
a second logic element electrically connected to the second switch,
wherein the first switch is configured to output a L level signal regardless of the output signal of the register when writing a configuration data written to the second switch is finished,
wherein the first switch comprises a first transistor, a second transistor, a third transistor, and a capacitor,
wherein a gate of the second transistor is electrically connected to one of a source and a drain of the first transistor,
wherein the gate of the second transistor is electrically connected to a first electrode of the capacitor,
wherein a gate of the first transistor is electrically connected to a first signal line,
wherein a gate of the third transistor is electrically connected to a second signal line, and
wherein the second signal line is configured to supply a signal for selecting one of contexts.

9. The semiconductor device according to claim 8, wherein the second switch is a logical conjunction circuit.

10. The semiconductor device according to claim 8, wherein the second switch is an AND circuit.

11. The semiconductor device according to claim 8, wherein the second transistor comprises an oxide semiconductor in a channel formation region.

12. The semiconductor device according to claim 8,
wherein the first logic element comprises a lookup table, and
wherein the register is configured to receive an output signal of the lookup table.

13. A semiconductor device comprising:
a first logic element;
a first switch electrically connected to the first logic element; and
a second logic element electrically connected to the first switch,
wherein the first logic element comprises a second switch,
wherein the second switch is configured to set an output potential of the first logic element to a L level,
wherein the first switch comprises a first transistor, a second transistor, a third transistor, and a capacitor,
wherein a gate of the second transistor is electrically connected to one of a source and a drain of the first transistor,
wherein the gate of the second transistor is electrically connected to a first electrode of the capacitor,
wherein a gate of the first transistor is electrically connected to a first signal line,
wherein a gate of the third transistor is electrically connected to a second signal line,
wherein the second signal line is configured to supply a signal for selecting one of contexts, and
wherein the first transistor comprises an oxide semiconductor in a channel formation region.

14. The semiconductor device according to claim 13, wherein the second switch is a logical conjunction circuit.

15. The semiconductor device according to claim 13, wherein the second switch is an AND circuit.

16. The semiconductor device according to claim 13, wherein the second transistor comprises an oxide semiconductor in a channel formation region.

17. A semiconductor device comprising:
a first logic element;
a switch electrically connected to the first logic element; and
a second logic element electrically connected to the switch,
wherein the first logic element comprises a memory electrically connected to a register,
wherein the memory is configured to hold data of the register, wherein the register is configured to set an output potential to a L level after the memory holds the data, wherein the switch comprises a first transistor, a second transistor, a third transistor, and a capacitor, wherein a gate of the second transistor is electrically connected to one of a source and a drain of the first transistor, wherein the gate of the second transistor is electrically connected to a first electrode of the capacitor, wherein a gate of the first transistor is electrically connected to a first signal line, wherein a gate of the third transistor is electrically connected to a second signal line, wherein the second signal line is configured to supply a signal for selecting one of contexts, and wherein the first transistor comprises an oxide semiconductor in a channel formation region.

18. The semiconductor device according to claim 17, wherein the memory comprises a transistor comprising an oxide semiconductor layer.

19. The semiconductor device according to claim 17, wherein the second transistor comprises an oxide semiconductor in a channel formation region.

20. A semiconductor device comprising:
a first logic element comprising:
 a register; and
 a first switch configured to receive an output signal of the register;
a second switch configured to receive an output signal of the first switch; and
a second logic element electrically connected to the second switch, wherein the first switch is configured to output a L level signal regardless of the output signal of the register when writing a configuration data written to the second switch is finished, wherein the first switch comprises a first transistor, a second transistor, a third transistor, and a capacitor, wherein a gate of the second transistor is electrically connected to one of a source and a drain of the first transistor, wherein the gate of the second transistor is electrically connected to a first electrode of the capacitor, wherein a gate of the first transistor is electrically connected to a first signal line, wherein a gate of the third transistor is electrically connected to a second signal line, wherein the second signal line is configured to supply a signal for selecting one of contexts, and wherein the first transistor comprises an oxide semiconductor in a channel formation region.

21. The semiconductor device according to claim 20, wherein the second switch is a logical conjunction circuit.

22. The semiconductor device according to claim 20, wherein the second switch is an AND circuit.

23. The semiconductor device according to claim 20, wherein the second transistor comprises an oxide semiconductor in a channel formation region.

24. The semiconductor device according to claim 20, wherein the first logic element comprises a lookup table, and wherein the register is configured to receive an output signal of the lookup table.

* * * * *